US009177893B2

(12) United States Patent
Mauder et al.

(10) Patent No.: US 9,177,893 B2
(45) Date of Patent: Nov. 3, 2015

(54) SEMICONDUCTOR COMPONENT WITH A FRONT SIDE AND A BACK SIDE METALLIZATION LAYER AND MANUFACTURING METHOD THEREOF

(75) Inventors: Anton Mauder, Kolbermoor (DE); Gerald Lackner, Arnoldstein (AT); Oliver Haeberlen, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 225 days.

(21) Appl. No.: 13/109,148

(22) Filed: May 17, 2011

(65) Prior Publication Data
US 2012/0292757 A1 Nov. 22, 2012

(51) Int. Cl.
*H01L 29/40* (2006.01)
*H01L 23/52* (2006.01)
(Continued)

(52) U.S. Cl.
CPC .......... *H01L 23/481* (2013.01); *H01L 21/6836* (2013.01); *H01L 23/53276* (2013.01); *H01L 23/544* (2013.01); *H01L 24/05* (2013.01); *H01L 29/78* (2013.01); *H01L 23/525* (2013.01); *H01L 23/53223* (2013.01); *H01L 23/53238* (2013.01); *H01L 23/53266* (2013.01); *H01L 24/13* (2013.01); *H01L 2221/68327* (2013.01); *H01L 2223/54433* (2013.01); *H01L 2223/54486* (2013.01); *H01L 2224/02372* (2013.01); *H01L 2224/02379* (2013.01); *H01L 2224/0401* (2013.01); *H01L 2224/04042* (2013.01); *H01L 2224/05023* (2013.01);
(Continued)

(58) Field of Classification Search
CPC . H01L 21/76898; H01L 23/481; H01L 29/78; H01L 2224/0233; H01L 2224/0235; H01L 2224/0237; H01L 2224/02373

USPC .......... 257/621, 698, 774, E21.597, E23.011, 257/E23.174
See application file for complete search history.

(56) References Cited

U.S. PATENT DOCUMENTS 7,111,149 B2 *  9/2006  Eilert ............................ 711/220
8,183,678 B2 *  5/2012  Lee et al. ...................... 257/686
(Continued)

FOREIGN PATENT DOCUMENTS

DE   19746642 A1   5/1999
DE   10225373 A1   4/2003
(Continued)

OTHER PUBLICATIONS

English language abstract of DE 10225373 A1 dated Apr. 30, 2003.
(Continued)

*Primary Examiner* — Jesse Y Miyoshi

(57) ABSTRACT

In various embodiments, a semiconductor component may include a semiconductor layer having a front side and a back side; at least one electronic element formed at least partially in the semiconductor layer; at least one via formed in the semiconductor layer and leading from the front side to the back side of the semiconductor layer; a front side metallization layer disposed over the front side of the semiconductor layer and electrically connecting the at least one electronic element to the at least one via; a cap disposed over the front side of the semiconductor layer and mechanically coupled to the semiconductor layer, the cap being configured as a front side carrier of the semiconductor component; a back side metallization layer disposed over the back side of the semiconductor layer and electrically connected to the at least one via.

13 Claims, 11 Drawing Sheets

(51) Int. Cl.
*H01L 23/48* (2006.01)
*H01L 23/544* (2006.01)
*H01L 23/00* (2006.01)
*H01L 21/683* (2006.01)
*H01L 29/78* (2006.01)
*H01L 23/525* (2006.01)
*H01L 23/532* (2006.01)

(52) U.S. Cl.
CPC ............... *H01L 2224/05025* (2013.01); *H01L 2224/05124* (2013.01); *H01L 2224/05147* (2013.01); *H01L 2224/05155* (2013.01); *H01L 2224/05166* (2013.01); *H01L 2224/05184* (2013.01); *H01L 2224/05611* (2013.01); *H01L 2224/05639* (2013.01); *H01L 2224/05644* (2013.01); *H01L 2224/05655* (2013.01); *H01L 2224/06102* (2013.01); *H01L 2224/131* (2013.01); *H01L 2224/1403* (2013.01); *H01L 2224/32225* (2013.01); *H01L 2224/48091* (2013.01); *H01L 2224/73253* (2013.01); *H01L 2224/94* (2013.01); *H01L 2924/01029* (2013.01); *H01L 2924/01322* (2013.01); *H01L 2924/1305* (2013.01); *H01L 2924/1306* (2013.01); *H01L 2924/13091* (2013.01); *H01L 2924/3025* (2013.01)

(56) References Cited

U.S. PATENT DOCUMENTS

| | | | |
|---|---|---|---|
| 8,247,906 B2* | 8/2012 | Law et al. | 257/774 |
| 2005/0046002 A1* | 3/2005 | Lee et al. | 257/678 |
| 2009/0315154 A1* | 12/2009 | Kirby et al. | 257/621 |
| 2010/0078778 A1* | 4/2010 | Barth et al. | 257/659 |
| 2010/0144094 A1* | 6/2010 | Chen et al. | 438/109 |

FOREIGN PATENT DOCUMENTS

| | | |
|---|---|---|
| DE | 10331322 A1 | 2/2005 |
| WO | 2005006432 A2 | 1/2005 |

OTHER PUBLICATIONS

English language abstract of DE 19746642 A1 dated May 6, 1999.

* cited by examiner

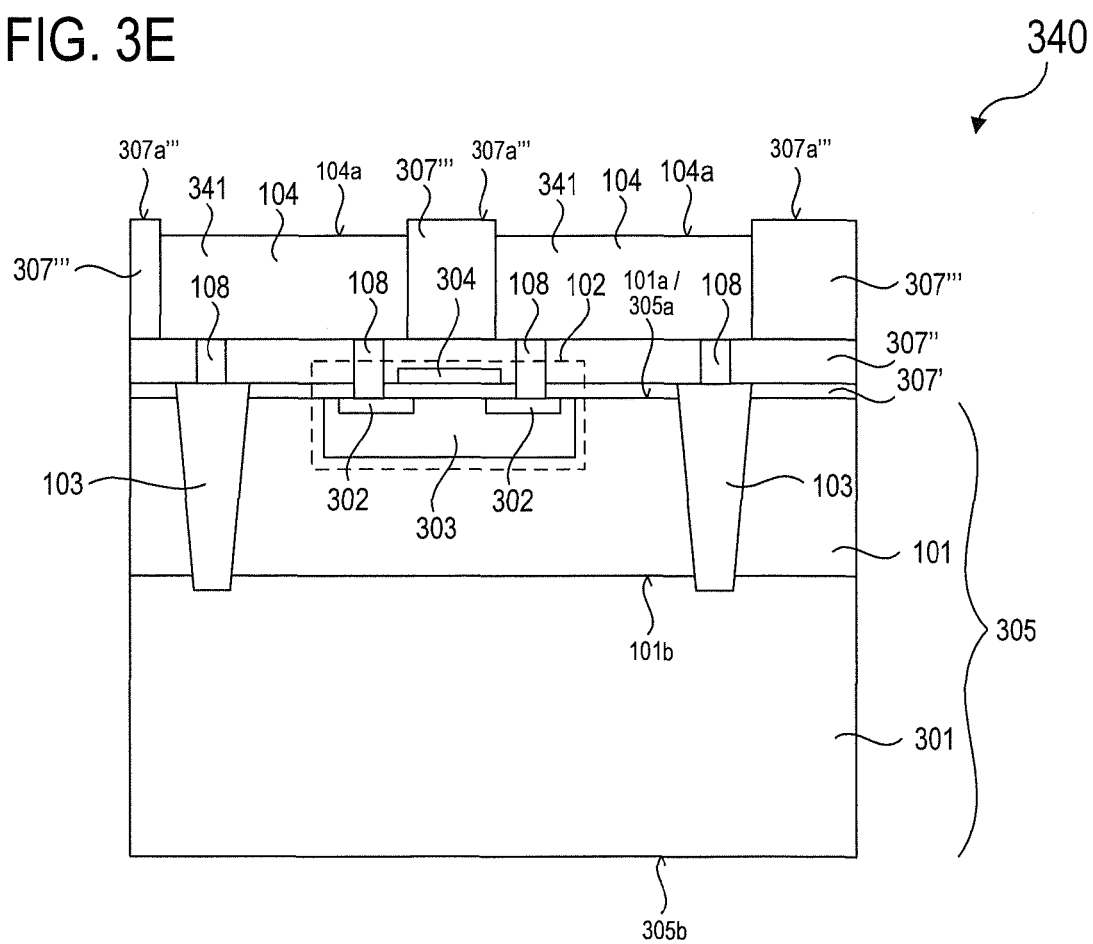

SEMICONDUCTOR COMPONENT WITH A FRONT SIDE AND A BACK SIDE METALLIZATION LAYER AND MANUFACTURING METHOD THEREOF

TECHNICAL FIELD

Various embodiments relate generally to a semiconductor component and a method of manufacturing a semiconductor component.

BACKGROUND

Today, semiconductor components or chips are usually fabricated using slices of semiconductor material, referred to as wafers. Thin chips may represent a great challenge not only during fabrication in the front-end, as with decreasing thickness the wafers may become very damageable, easily break and bend strongly due to their low stiffness. Therefore, devices and processes may be desirable that allow for safe handling of thin semiconductor components or chips.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A to 3G show various processing stages in a method of manufacturing a semiconductor component in accordance with an embodiment;

DESCRIPTION

Figure 1:
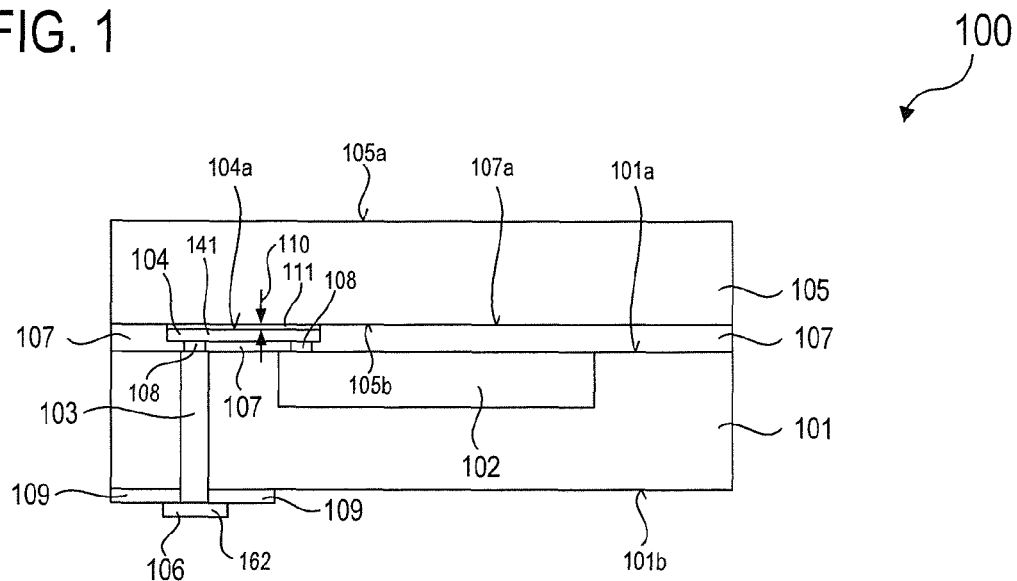
FIG. 1 shows a semiconductor component in accordance with an embodiment.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. The following detailed description therefore is not to be taken in a limiting sense, and the scope of the present invention is defined by the appended claims.

Various embodiments are provided for devices, and various embodiments are provided for methods. It will be understood that basic properties of the devices also hold for the methods and vice versa. Therefore, for sake of brevity, duplicate description of such properties may be omitted.

The terms "coupling" or "connection" as used herein are intended to include a direct "coupling" or direct "connection" as well as an indirect "coupling" or indirect "connection", respectively.

The terms "disposed over" or "arranged over" as used herein are intended to include arrangements where a first element or layer is disposed or arranged on a second element or layer with no further elements or layers located in-between, as well as arrangements where a first element or layer is disposed or arranged above a second element or layer with one or more additional elements or layers located between the first element or layer and the second element or layer.

Today, semiconductor components or chips are usually fabricated using slices of semiconductor material, referred to as wafers. Thin chips may represent a great challenge not only in the fabrication in the front-end, as with decreasing thickness the wafers may become very damageable, easily break and bend strongly due to their low stiffness.

Another critical step may be the assembly in the back-end where, after singulation of the dies (also referred to as dicing), the thin semiconductor may have to be picked from a dicing carrier, applied to a lead frame and connected with the lead frame before electrical connections to the chip and an encapsulation, e.g. by means of remolding, may be realized. The mechanical forces that may occur during picking of the dies and die-bonding may represent high stress for such thin chips, which in the future may have—depending, for example, on a required blocking voltage—thicknesses down to a few µm, for example in the range from about 1 µm to about 50 µm. For such thin semiconductors, damage of the chip back side in connection with electrical failure, possibly not until in the field, or immediate chip breakage may probably be not preventable with today's structures, processes and technologies.

In the front-end, there are by now suitable carrier technologies such as, for example, foil carriers, glass carriers, glue stacks etc., which have sufficient technological maturity and are used in production. These carrier systems may differ with respect to their temperature resistance and the use of vacuum and/or wet chemical processes, and they may have certain different limits. However, for the practical implementation a combination of a suitable carrier technology in connection with circumvention or avoidance strategies may usually be found in the manufacturing process so that this aspect will not be regarded further in the present application.

For very thin wafers, sawing of the wafer may represent additional high stress as commonly only a part of the sawing trace will be cut away while the remaining part will be broken away by the mechanical pressure of the sawing blade. If the initial thickness of the wafer is very small (for example as small as the sawing trace's rest thickness that is commonly broken away) the sawing parameters may have to be adjusted to enable sawing. For example, the feed may have to be reduced significantly or alternative singulation techniques such as laser cutting or plasma etching may have to be used instead, which may partly lead to significantly higher costs.

During singulation, the wafer may commonly be located on a carrier, usually an adhesive foil. The adhesive power of the foil should be high enough such that the individual chips may be kept securely during singulation and transport and may, for example, not fly away and damage the sawing blade or other chips. On the other hand, the adhesive power should be low enough such that during the assembly itself the picking of the chips and the placement of the chips on the lead frame may be possible without damaging the chips. Today, for thin wafers mostly adhesives may be used that may have a high adhesive power (during singulation and transport) that may be significantly reduced (shortly before or during the die-bonding), for example by means of irradiation with UV light. It will be understood that the remaining adhesive power during the die-bonding may allow only a certain maximum chip area, which may be dependent on the chip thickness.

During die-bonding small defects may frequently occur between the chip and the lead frame, which may, for example, lead to mechanical destruction of the chip during a subsequent wire-bonding process. The tolerance with respect to such defects may also decrease with decreasing chip thickness.

If, for example, eutectic bonding or diffusion soldering are used, then specially formed stamps, which may allow for a very uniform pressing, may have to be employed for the thinnest chips.

The challenges of thin chips during assembly may be significant and may, for example, require assembly processes that are more complex and/or more costly.

FIG. 1 shows a semiconductor component 100 in accordance with an embodiment.

In accordance with various embodiments, the semiconductor component 100 may include a semiconductor layer 101. The semiconductor layer 101 may have a front side 101a and a back side 101b. The front side 101a and the back side 101b may be opposite sides of the semiconductor layer 101, as shown.

In accordance with various embodiments, the semiconductor layer 101 may be a useful layer of the semiconductor component 100. In accordance with various embodiments, the semiconductor layer 101 may have been part of a thicker wafer (not shown, see e.g. FIG. 3A) that may have been thinned (for example, using conventional techniques such as grinding and/or polishing and/or etching and/or chemical mechanical polishing (CMP), alternatively other suitable techniques) to obtain a thin semiconductor useful layer (i.e. semiconductor layer 101). Currently, typical wafer thicknesses (before thinning) may, for example, be in the range from about 500 μm to about 1000 μm, although other thickness values may be possible as well.

In accordance with various embodiments, the semiconductor layer 101 may, for example, have a thickness in the range from about 1 μm to about 70 μm, for example in the range from about 1 μm to about 50 μm in some embodiments, for example in the range from about 1 μm to about 30 μm in some embodiments, for example in the range from about 1 μm to about 15 μm in some embodiments. Alternatively, other values of the thickness may be possible. The value of the layer thickness may be adapted, for example, to specific requirements or constraints to be met by the semiconductor component 100, for example a specific value of a blocking voltage to be achieved. For example, as a rule of thumb, a layer thickness of 1 μm per 10 volts of blocking voltage may be desired. In other words, each additional μm of layer thickness may increase the blocking voltage by about 10 volts.

In accordance with some embodiments, the semiconductor layer 101 may include or may be made of silicon (Si). In accordance with other embodiments, the semiconductor layer 101 may include or may be made of other suitable semiconductor materials, including also compound semiconductor materials.

In accordance with various embodiments, the semiconductor component 101 may include at least one electronic element 102. The electronic element 102 may be formed at least partially in the semiconductor layer 101. In the embodiment of FIG. 1, the electronic element 102 is shown to be formed entirely in the semiconductor layer 101, however in accordance with various embodiments, parts of the electronic element 102 may also be located outside the semiconductor layer 101, for example in one or more layers located on or above and/or one or more layers located below the semiconductor layer 101. In other words, some parts or regions of the electronic element 102 may be formed by portions of the semiconductor layer 101 while other parts or regions of the electronic element 102 may be formed by portions of other layers of the semiconductor component 100, in accordance with various embodiments. The electronic element 102 may also be referred to as useful component herein.

In accordance with various embodiments, the electronic element 102 may, for example, include or be configured as a (lateral or vertical) transistor (for example, as a field effect transistor (FET) or as a bipolar junction transistor (BJT)) or as a diode. In accordance with some embodiments, the electronic element 102 may include or may be configured as a different element.

In accordance with some embodiments, the semiconductor component 100 may include more than one electronic element. For example, in accordance with some embodiments, an integrated circuit (IC), including for example a plurality of electronic elements (such as, for example, transistors and/or diodes and/or other electronic elements), may be formed at least partially in the semiconductor layer 101. For example in case that an integrated circuit (IC) is provided, the semiconductor component 100 may also be referred to as a die or chip.

In accordance with various embodiments, the semiconductor component 101 may include at least one via 103 formed in the semiconductor layer 101. The at least one via 103 may lead from the front side 101a to the back side 101b of the semiconductor layer 101. The via 103 may also be referred to as a through-contact, or as a through silicon via (TSV) in case of a semiconductor layer 101 that includes silicon or is made of silicon.

Only one via 103 is shown in FIG. 1, however, in accordance with various embodiments, a plurality of vias may be formed in the semiconductor layer 101.

In accordance with an embodiment, the at least one via 103 may have been formed, for example, by forming at least one hole in the semiconductor layer 101, electrically insulating the at least one hole from the semiconductor material of the semiconductor layer 101, and filling the at least one hole with electrically conductive material.

In accordance with some embodiments, the at least one hole may have been formed in the semiconductor layer 101 using an etch process. In accordance with an embodiment, the etch process may be a dry-etch process.

In accordance with an embodiment, electrically insulating the at least one hole from the semiconductor material of the semiconductor layer 101 may, for example, be achieved by forming (e.g. depositing or thermally growing) one or more electrically insulating layers on the side walls of the at least one hole.

In accordance with some embodiments, it may also be possible that one or more of the through-contacts or vias 103 may have the same electrical potential as the substrate or semiconductor layer 101. For example in this case, the one or more insulating layers may be dispensable.

In accordance with some embodiments and depending, for example, on the subsequent filling process of the through-contact or via 103, one or more bather layers may be formed, for example, to prevent a contamination of the semiconductor material of the semiconductor layer 101 by the filling material. In accordance with some embodiments, the one or more bather layers may consist of or may include one or more nitride materials, for example $Si_3N_4$ (also as non-stoichiometric compound), TiN, TaN, or other suitable materials. In accordance with various embodiments, the bather layer or layers may be formed over the side walls of the at least one hole, for example on the one or more electrically insulating layers (if present).

In accordance with an embodiment, the electrically conductive material used for filling the at least one hole may include or may be a conductive semiconductor material and/or a metal and/or a metal-semiconductor compound and/or carbon, for example silicon, aluminium, copper, tungsten, titanium, tantalum, TiSi, TaSi, CoSi. In accordance with some embodiments, a barrier layer may be formed between filling material and semiconductor material or between filling material and insulating material (in case the at least one hole is electrically insulated from the semiconductor material of the semiconductor layer 101).

In accordance with other embodiments, the at least one via 103 may have been formed using other suitable techniques.

In accordance with various embodiments, the semiconductor component 100 may further include a front side metallization layer 104 disposed over at least a part of the front side 101a of the semiconductor layer 101 to electrically connect the at least one electronic element 102 with the at least one via 103. The front side metallization layer 104 may be electrically connected to the at least one electronic element 102 (e.g. to a connection or terminal region of the electronic element 102) and to the at least one via 103.

In accordance with various embodiments, the front side metallization layer 104 may include one or more conductive lines or traces, also referred to as redistribution traces. Only one redistribution trace 141 connected to the electronic element 102 and the via 103 is shown in FIG. 1, however, additional redistribution traces may be provided that may, for example, be connected to the electronic element 102 (e.g. to one or more connection or terminal regions of the electronic element 102) on the one hand and to additional vias on the other hand, in accordance with various embodiments. Thus, in accordance with various embodiments, one or more connection or terminal regions of an electronic element may be electrically connected via one or more redistribution traces of a front side metallization layer. In accordance with various embodiments, the one or more redistribution traces may be connected to respective vias leading from the front side to the back side of the semiconductor layer.

In accordance with various embodiments, the front side metallization layer 104 may include or may be made of a suitable metallization material such as, for example, a suitable conductor, e.g. silicon (Si), for example polycrystalline silicon or amorphous silicon, aluminum (Al), copper (Cu), carbon (C), or an alloy and/or a layer stack including one or more of the aforementioned materials. Alternatively or additionally, the front side metallization layer 104 may include or may be made of other suitable metallization materials, e.g. other suitable metals or metal alloys.

In accordance with various embodiments, the semiconductor component 100 may include a cap 105. The cap 105 may be disposed over the front side 101a of the semiconductor layer 101 and may be mechanically coupled to the semiconductor layer 101, for example via one or more layers disposed between the cap 105 and the semiconductor layer 101 in accordance with some embodiments.

In accordance with various embodiments, the cap 105 may be configured as a front side carrier of the semiconductor component 100. That is, the cap 105 may be configured to serve as a carrier for handling of the semiconductor component 100 during a fabrication process.

The cap 105 may have an upper surface 105a and a lower surface 105b opposite the upper surface 105a. The lower surface 105b may face the semiconductor layer 101, as shown.

The cap 105 may be mechanically coupled to the semiconductor layer 101 and may serve as an in-situ carrier during the processing of the semiconductor component 100, and furthermore as a package (or at least part of a package) of the processed semiconductor component 100. That is, in accordance with various embodiments the cap 105 may be applied during the fabrication of the semiconductor component 100 and may be used as a carrier to handle the semiconductor component 100 during the fabrication process, and the cap 105 may remain in the fully processed component and serve as a package (or part of a package) for the component.

In accordance with various embodiments, the cap 105 may have a thickness in the range from about 50 µm to about 1000 µm, for example in the range from about 100 µm to about 500 µm in accordance with some embodiments. The thickness of the cap 105 may, for example, be adapted to the thickness of the useful layer (i.e. semiconductor layer 101) and may have other values in accordance with other embodiments.

In accordance with some embodiments, the cap 105 may be configured as an opaque cap. In other words, the cap 105 may include or may be made of an opaque material. In this way, the semiconductor material of the semiconductor layer 101 beneath the cap 105 may, for example, be shielded from light sources during later operation.

In accordance with some embodiments, the semiconductor component 100 may include at least one dielectric layer 107 disposed over the front side 101a of the semiconductor layer 101, and between the semiconductor layer 101 and the cap 105. In FIG. 1, only one dielectric layer 107 is shown, however, more than one dielectric layer 107 may be stacked in accordance with various embodiments. In addition, one or more bather layers (for example against sodium (Na) ions) may be provided between the semiconductor layer 101 and the cap 105 in accordance with some embodiments. For example, in accordance with one embodiment, a barrier layer may be located directly below the topmost dielectric layer or, alternatively, deeper in the wiring stack. In accordance with an embodiment, the one or more barrier layers may, for example, be a silicon nitride ($Si_3N_4$) layer.

In accordance with some embodiments, contact holes 108 may be formed in the at least one dielectric layer 107 and may be filled with electrically conductive material such as, for example, polysilicon or metal, to electrically connect the front side metallization layer 104 with the electronic element 102 and the via 103, as shown. For example, one contact hole 108 may be disposed over the electronic element 102 and may be in contact with the electronic element 102 and the front side metallization layer 104, and another contact hole 108 may be disposed over the via 103 and may be in contact with the via 103 and the front side metallization layer 104.

In FIG. 1, two contact holes 108 are shown as an example, however, additional contact holes 108 may be provided in accordance with various embodiments.

In accordance with various embodiments, the contact holes 108 may, for example, be formed using an etch process to etch holes in the at least one dielectric layer 107 and subsequent filling of the holes with electrically conductive material such as, for example, polysilicon or metal.

In accordance with various embodiments, the front side metallization layer 104 may be electrically insulated from the semiconductor layer 101 by means of the at least one dielectric layer 107, as shown.

In accordance with some embodiments, a bather layer may be formed between the metallization layer 104 and/or the conductive filling material of the contact hole 108 and the semiconductor layer 101 and/or the at least one dielectric layer 107. This bather layer may, for example, consist of or may include one or more nitride materials, for example $Si_3N_4$ (also as non-stoichiometric compound), TiN, TaN or other suitable materials.

In accordance with various embodiments, the cap 105 may include or may be made of an electrically insulating material such as, for example, glass, a plastic material or plastic laminate (for example, having a fiber reinforcement in accordance with an embodiment). In accordance with some embodiments, similar or the same materials as used in printed circuit board (PCB) fabrication such as, for example, glass fiber epoxy resin compounds or teflon compounds may be used, for example.

Alternatively, in accordance with some embodiments, the cap 105 may include or may be made of an electrically conductive material such as, for example, copper (Cu), nickel (Ni), aluminum (Al), tungsten (W), titanium (Ti), or a stack and/or an alloy including one or more of the aforementioned materials. In accordance with some embodiments and, for example, for easier assembly these conductive materials may be coated with other conductive materials such as e.g. silver (Ag), gold (Au), nickel (Ni), tin (Sn) to improve e.g. corrosion behavior or wettability during soldering processes. Also, conductive laminatable materials (i.e. materials suitable for laminating) such as, for example, metal meshes with suitable binders may be used analogously to conductive homogenous caps, in accordance with some embodiments.

In accordance with various embodiments, the cap 105 may be applied to an upper surface 107a of the dielectric layer 107 (or of the topmost layer of the dielectric layer stack if more than one dielecric layer 107 is present), as shown. That is, in accordance with various embodiments, the cap 105 may be mechanically coupled to the semiconductor layer 101 via the dielectric layer (or layer stack) 107.

In accordance with various embodiments, the cap 105 may be bonded to the upper surface 107a of the dielectric layer 107, for example by means of anodic bonding or adhesive bonding. For example in case of a cap 105 including or made of glass, the cap 105 may also be applied to the dielectric layer 107 by means of a glass frit.

In accordance with various embodiments, an upper surface 104a of the front side metallization layer 104 may be located at a lower level or at the same level as the upper surface 107a of the dielectric layer 107. In other words, in accordance with various embodiments, it may be provided that the front side metallization layer 104 is not higher than the surrounding dielectric material of the dielectric layer (or layer stack) 107. In FIG. 1, it is shown that the upper surface 104a of the front side metallization layer 104 is located at a lower level than the upper surface 107a of the dielectric layer (or layer stack) 107 so that a distance (denoted by double arrow 110 in FIG. 1) is provided between the upper surface 104a of the front side metallization layer 104 and the cap 105. In accordance with some embodiments, a cavity 111 may be located between the front side metallization layer 104 and the cap 105, as shown.

In accordance with various embodiments, the semiconductor component 100 may include a back side metallization layer 106 disposed over at least a part of the back side 101b of the semiconductor layer 101. The back side metallization layer 106 may be electrically connected to the via 103. The back side metallization layer 106 may serve to electrically contact the at least one electronic element 102 (for example, to contact a connection or terminal region of the electronic element 102).

In accordance with various embodiments, the back side metallization layer 106 may include a number of portions that may be electrically insulated from each other and electrically connected to different vias. In FIG. 1, a single portion 162 electrically connected to the via 103 is shown, however in accordance with other embodiments, the back side metallization layer 106 may include a plurality of portions that may be electrically connected to respective ones of a plurality of vias.

The back side metallization layer 106 may include or may be made of a suitable metallization material such as, for example, a suitable metal, e.g. aluminum (Al), copper (Cu), nickel (Ni), aluminium (Al), titanium (Ti), tungsten (W), or a stack and/or an alloy including one or more of the aforementioned materials. In accordance with some embodiments and, for example, for easier assembly these conductive materials may be coated with other conductive materials such as e.g. silver (Ag), gold (Au), nickel (Ni), tin (Sn) to improve e.g. corrosion behavior or wettability during soldering processes. Alternatively or additionally, the back side metallization layer 106 may include or may be made of other suitable metallization materials, e.g. other suitable metals or metal alloys.

In accordance with some embodiments, the semiconductor component 100 may include at least one passivation layer 109 disposed over (e.g. directly on) at least a part of the back side 101b of the semiconductor layer 101, and between the back side metallization layer 106 and the semiconductor layer 101, as shown in FIG. 1. The passivation layer 109 may serve to electrically insulate the back side metallization layer 106 (or portions of the back side metallization layer 106) from the semiconductor layer 101. The at least one via 103 may extend through the passivation layer 109 and may be in contact with the back side metallization layer 106, as shown.

Figure 3A:
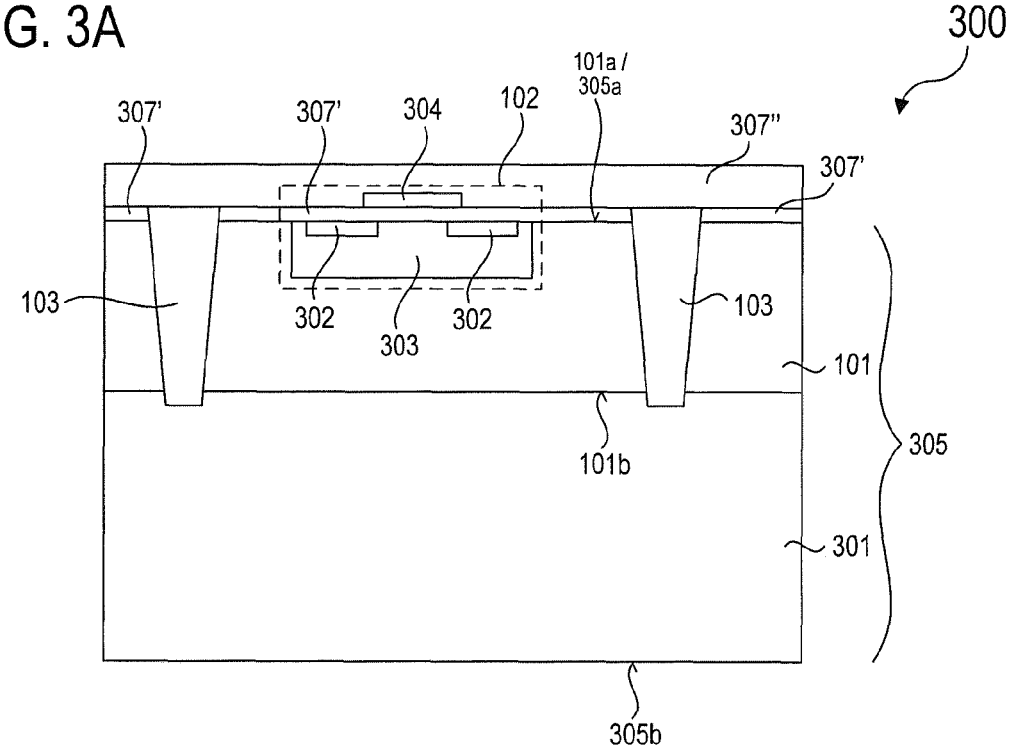
Figure 3B:
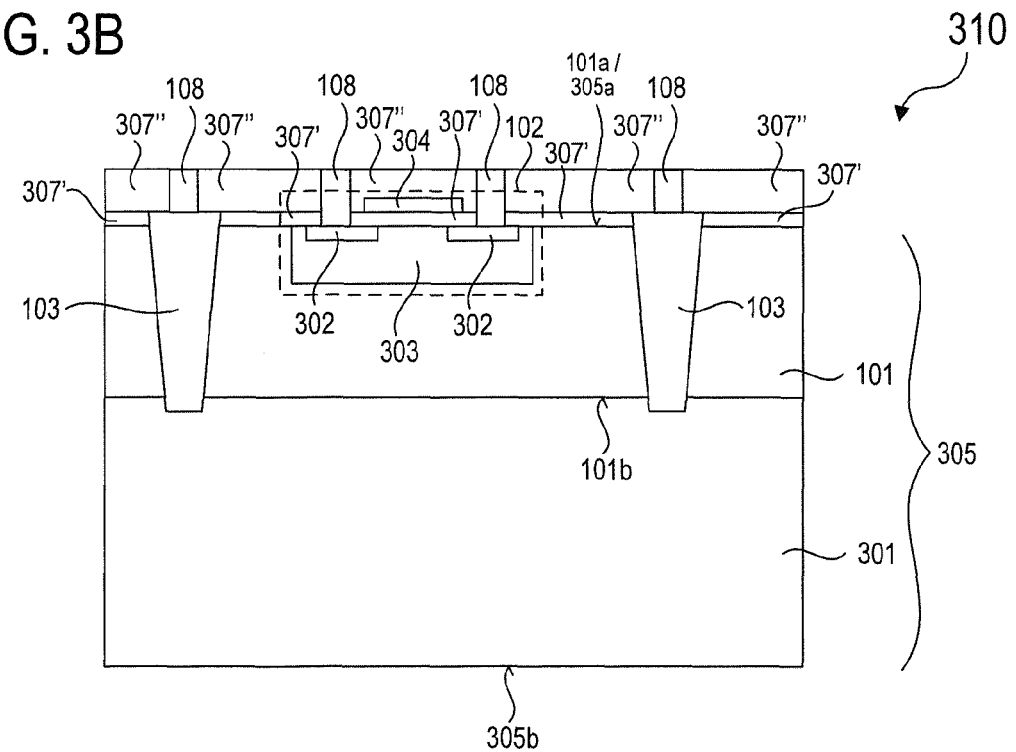
Figure 3C:
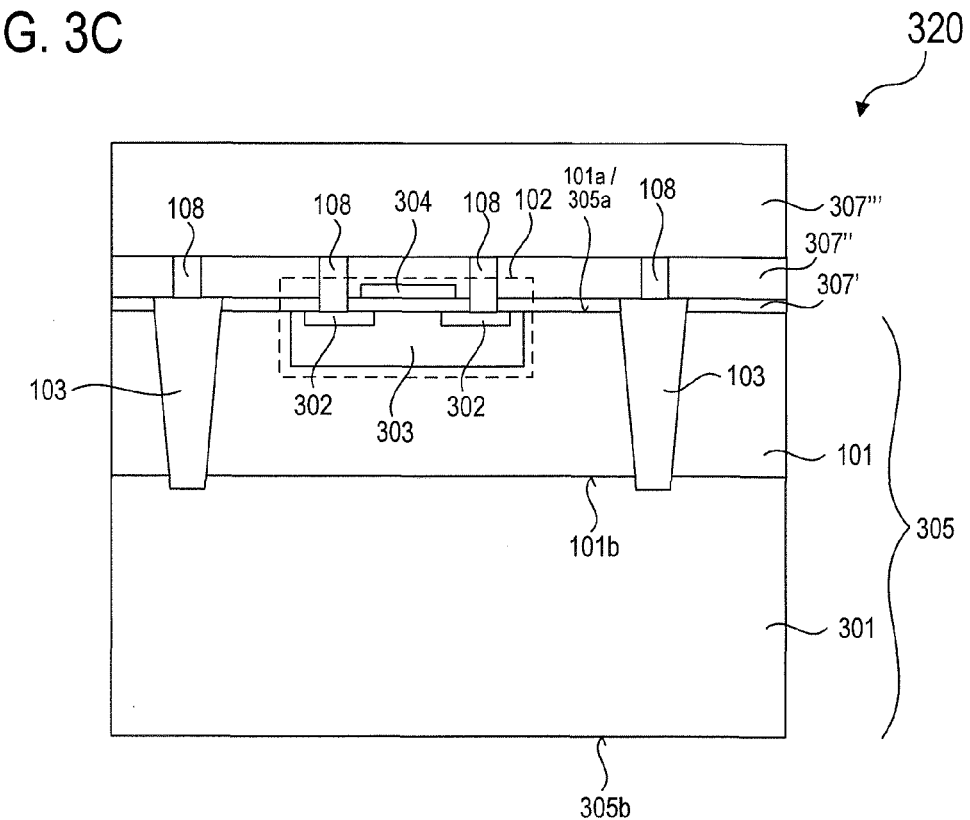
Figure 3D:
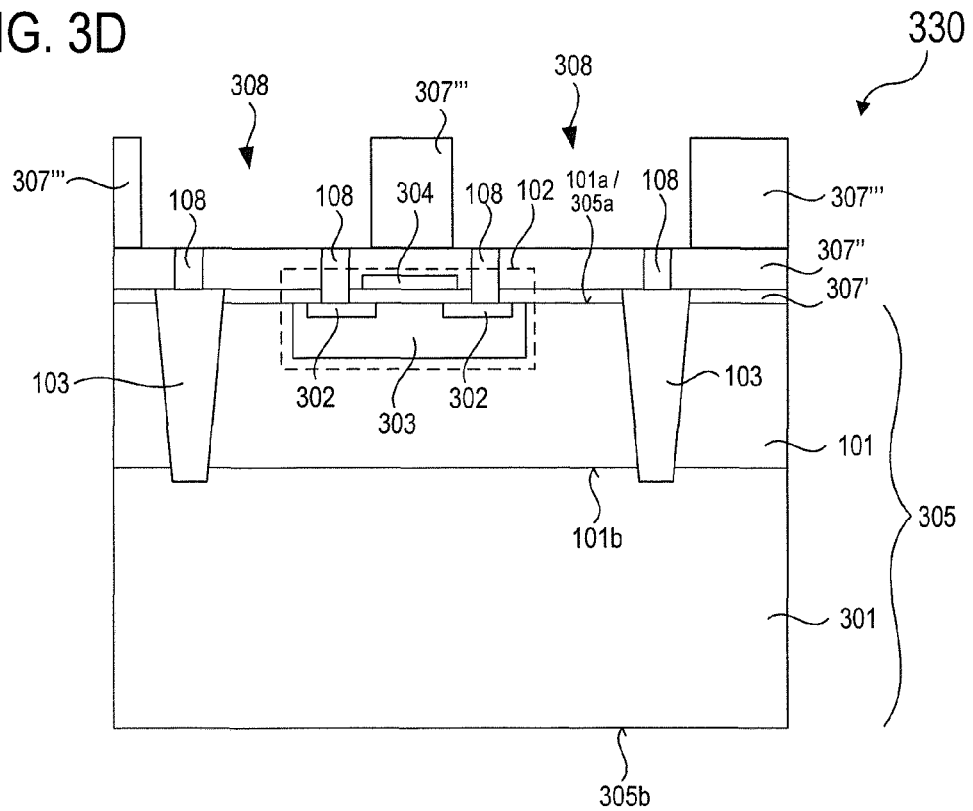
Figure 3F:
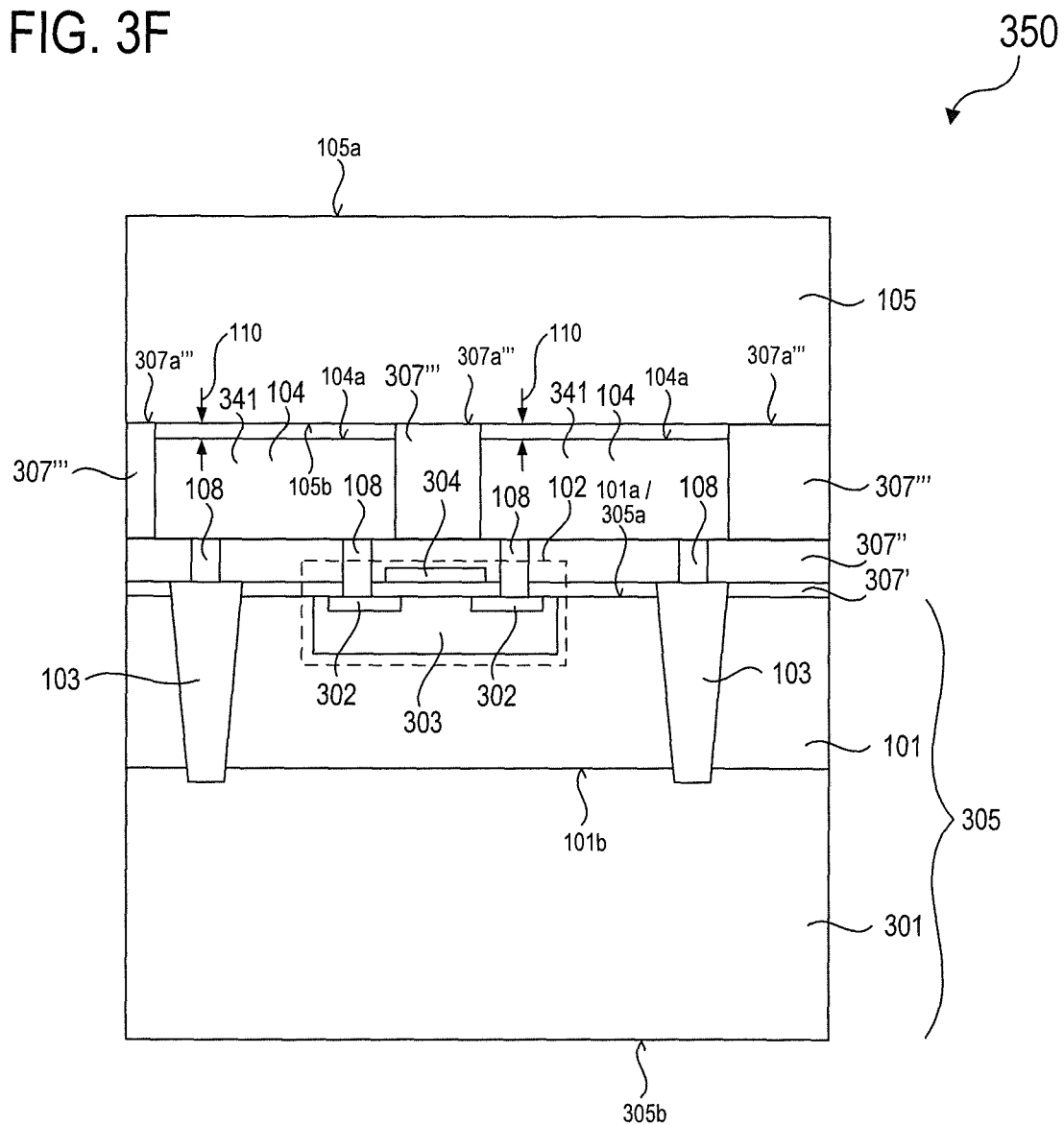
Figure 3G:
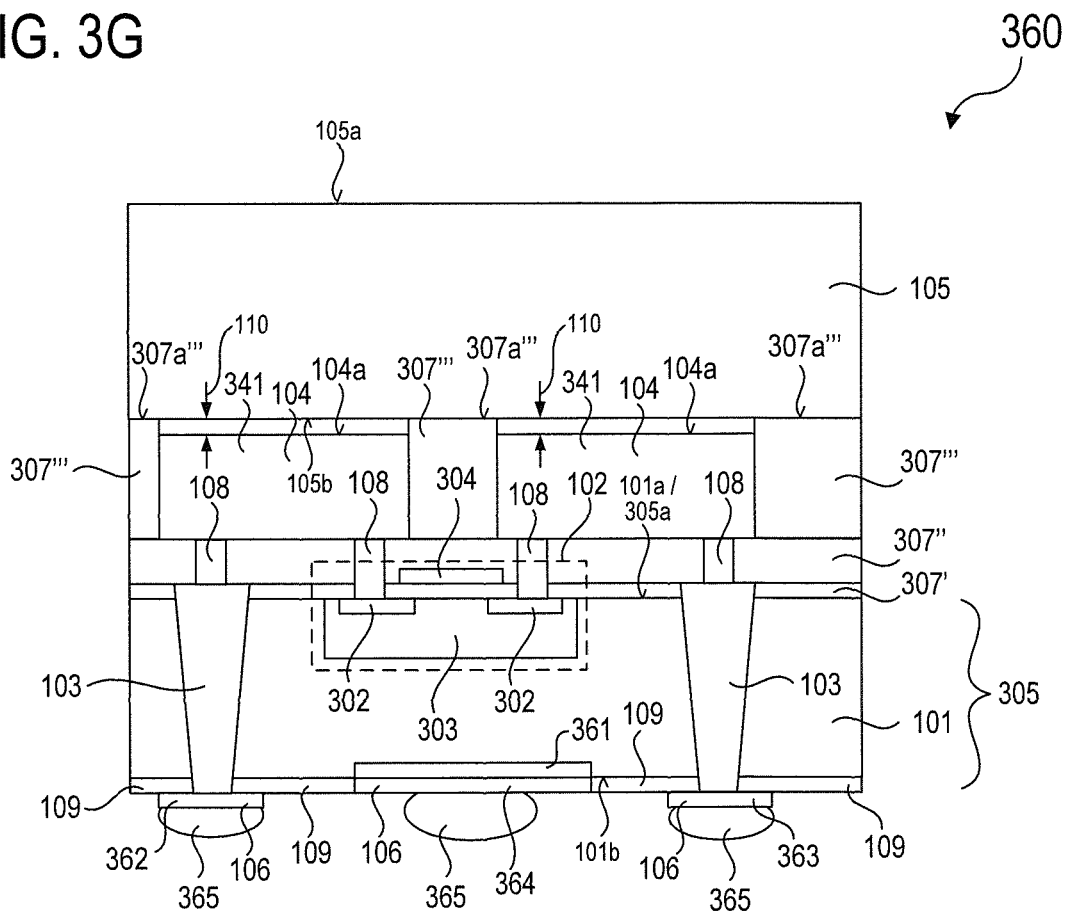

In accordance with some embodiments, the back side metallization layer 106 may include a portion that may be electrically connected to the semiconductor layer 101 to provide, for example, a substrate contact, in other words an electrical contact to the semiconductor layer 101 (not shown in FIG. 1, see e.g. FIG. 3G). To this end, that portion of the back side metallization layer 106 may, for example, be formed on the back side 101b of the semiconductor layer 101.

Figure 8:
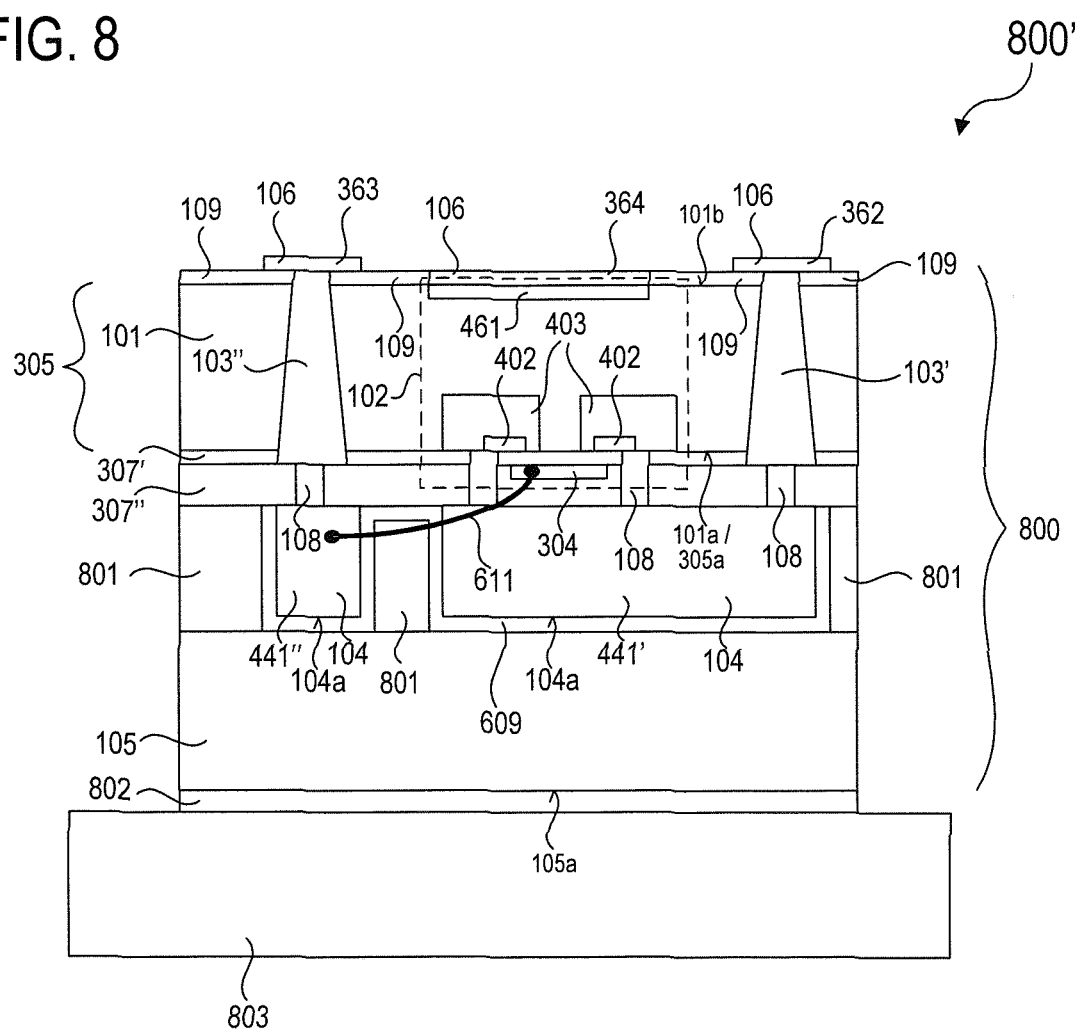
FIG. 8 shows a semiconductor component arrangement in accordance with an embodiment.

In accordance with some embodiments, the semiconductor component 100 may be mounted on a lead frame (not shown, see e.g. FIG. 8). To this end, the upper surface 105a of the cap 105 may be attached to the lead frame, for example by means of an adhesive process or, after deposition of a corresponding metallization on the upper surface 105a, by means of soldering.

Figure 9:
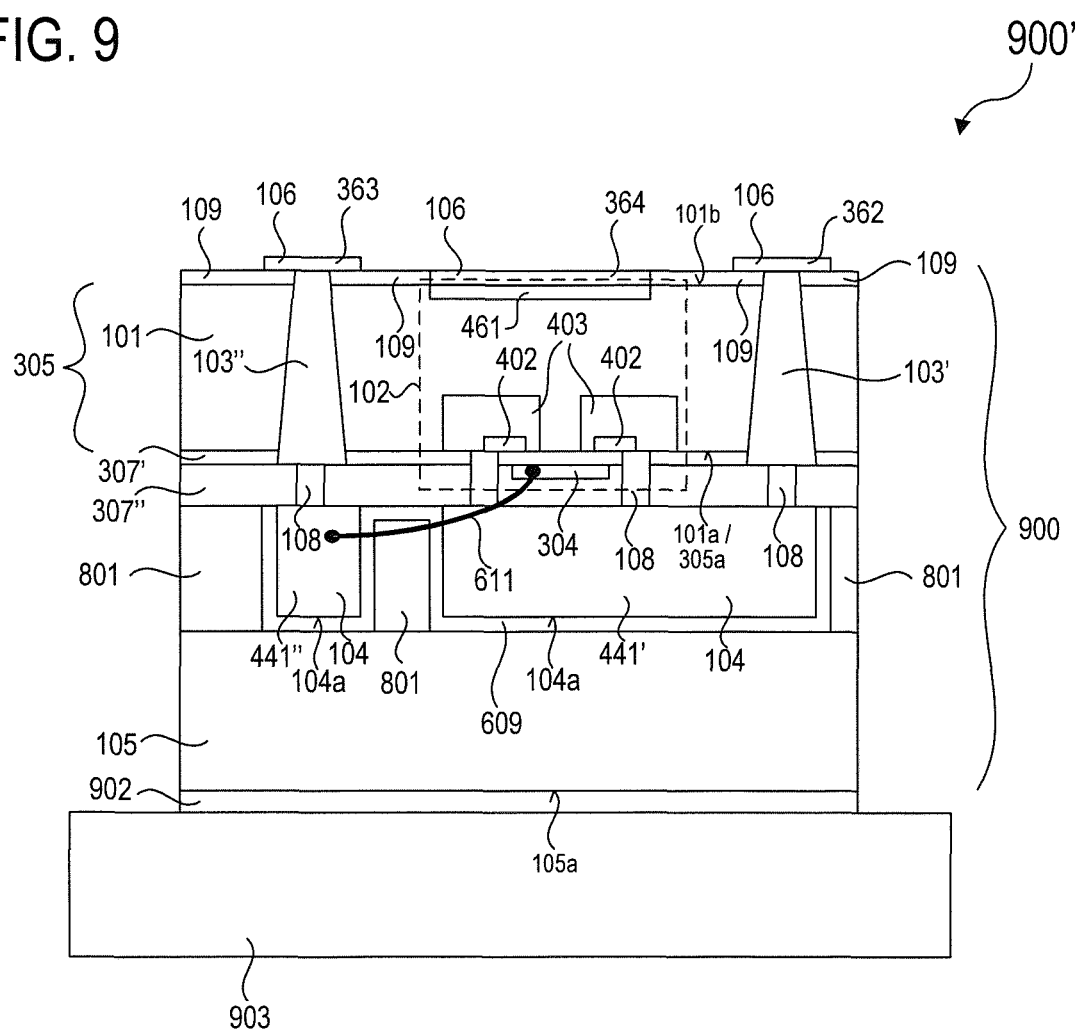
FIG. 9 shows a semiconductor component arrangement in accordance with an embodiment.

In accordance with some embodiments, the semiconductor component 100 may be mounted on a cooling element or heat sink (not shown, see e.g. FIG. 9). To this end, the upper surface 105a of the cap 105 may be attached to the cooling element or heat sink, for example by means of a heat conducting paste disposed between the cap 105 and the cooling element or heat sink.

Figure 2:
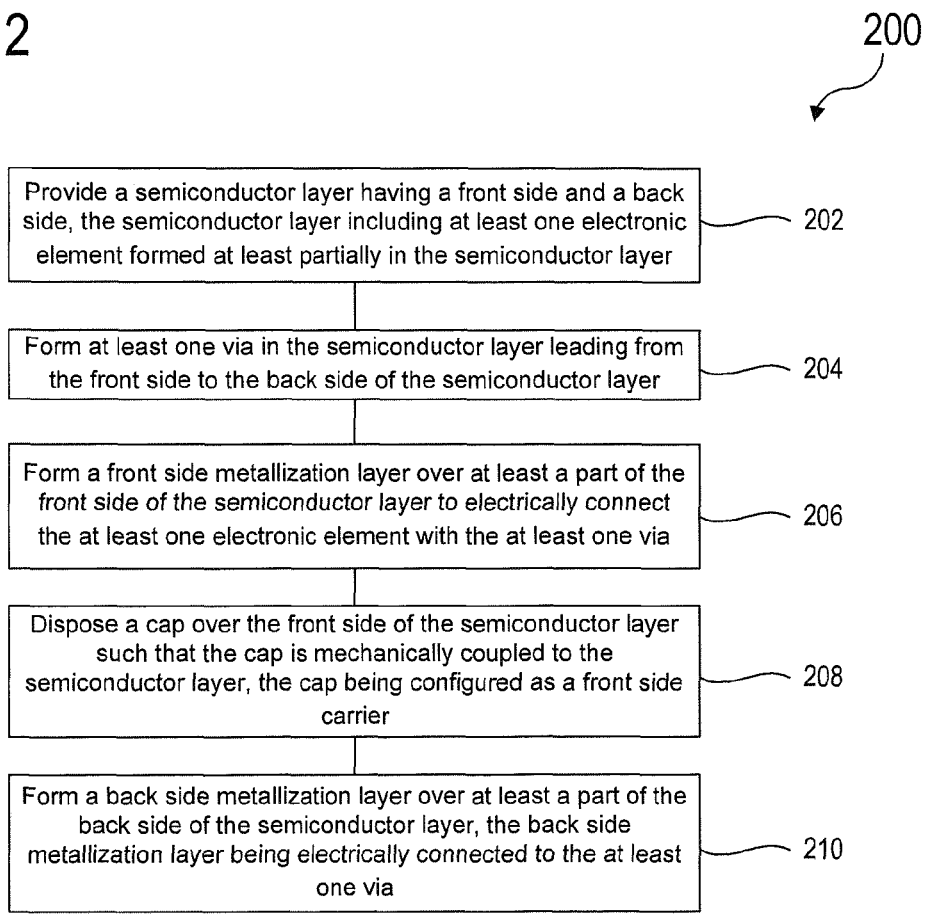
FIG. 2 shows a method of manufacturing a semiconductor component in accordance with an embodiment.

FIG. 2 shows a method 200 of manufacturing a semiconductor component in accordance with an embodiment.

In 202, a semiconductor layer having a front side and a back side may be provided, the semiconductor layer including at least one electronic element formed at least partially in the semiconductor layer. The semiconductor layer and/or the electronic element may, for example, be formed and/or configured in accordance with one or more embodiments described herein.

In 204, at least one via may be formed in the semiconductor layer leading from the front side to the back side of the semiconductor layer. The at least one via may, for example, be formed and/or configured in accordance with one or more embodiments described herein.

In 206, a front side metallization layer may be formed over at least a part of the front side of the semiconductor layer to electrically connect the at least one electronic element with the at least one via. The front side metallization layer may, for example, be formed and/or configured in accordance with one or more embodiments described herein.

In 208, a cap may be disposed over the front side of the semiconductor layer such that the cap is mechanically coupled to the semiconductor layer, the cap being configured as a front side carrier. The cap may, for example, be formed and/or configured in accordance with one or more embodiments described herein.

In 210, a back side metallization layer may be formed over at least a part of the back side of the semiconductor layer, the back side metallization layer being electrically connected to the at least one via, for example to electrically contact the at least one electronic element. The back side metallization layer may, for example, be formed and/or configured in accordance with one or more embodiments described herein.

In accordance with various embodiments described herein, an assembly process may, preferably, be rendered obsolete or, at least, may be facilitated significantly. In accordance with various embodiments, a carrier and a corresponding process may be provided, which may allow for processing of semiconductor wafers down to wafer thicknesses of a few micrometers (μm), for example wafer thicknesses in the range from about 1 μm to about 70 μm, for example in the range from about 1 μm to about 50 μm in some embodiments, for example in the range from about 1 μm to about 30 μm in some embodiments, for example in the range from about 1 μm to about 15 μm in accordance with some embodiments. Alternatively, other values of the wafer thickness may be possible.

In accordance with various embodiments, additional processes for redistribution, contacting and passivation may be introduced in the front-end on wafer level so that at least for surface-mountable devices no additional package may be needed. In particular, a front side carrier remaining on a semiconductor component or chip may be used in accordance with various embodiments. Contacting of the semiconductor component or chip may be realized on the back side of the semiconductor component or chip in accordance with various embodiments.

In accordance with various embodiments, a carrier system may be provided, which may allow for reliable or safe handling during wafer fabrication and thereafter, even with thinnest semiconductors.

In accordance with various embodiments, one or more holes may be formed in a semiconductor useful layer at a time that may be matched to the fabrication process of the product. The hole or holes may later serve as one or more through-contacts or vias (also referred to as Through Silicon Vias (TSV) in case of a silicon-based useful layer). Subsequently or later, depending on the requirements, the hole(s) may be laterally electrically insulated from the semiconductor useful layer and may be filled with conductive material in accordance with various embodiments. Since only the semiconductor useful layer may have to be etched through (for example using a dry etch process; alternatively, other etch processes may be used), the diameter of the hole(s) may be chosen to be small, accordingly. For example in dry etching, aspect ratios (which means the ratio of trench depth related to the upper trench width) between 10 and 100 may be common, where trenches with linear trench openings may, for example, have higher aspect ratios compared to trenches with circular trench openings. The minimum trench openings or windows in the mask during trench etching may be linked to the final thickness of the semiconductor layer 101. Also, the thickness of an insulating layer at the sidewalls of the trench may have to be taken into account and may increase the minimum opening of the trench openings. For example, in accordance with some embodiments, the diameter of the hole(s) or the opening of a linear trench may be in the range from about 0.2 μm to about 5 μm. However, in accordance with other embodiments, the diameter may have a different value.

FIGS. 3A to 3G show, as schematical cross-sectional views, different processing stages in a method of manufacturing a semiconductor component in accordance with an embodiment. Parts of the semiconductor component that are the same as in the semiconductor component 100 shown in FIG. 1 are labelled with the same reference numerals as in FIG. 1 and reference is also made to the description above.

FIG. 3A shows in a view 300 a processing stage with fabricated through-contacts (vias) 103 before deposition of a front side metallization, in accordance with an embodiment.

A semiconductor layer 101, also referred to as semiconductor useful layer or, short, useful layer, may be part of a wafer 305 and may be located over a carrier portion 301 of the wafer 305. The semiconductor layer 101 may have a front side 101*a* (also referred to as upper surface side) that may coincide with a front side 305*a* of the wafer 305, and a back side 101*b* (also referred to as lower surface side) that may adjoin the carrier portion 301 of the wafer 305. The wafer 305 may further have a back side 305*b* opposite the front side 305*a*. The vias 103 may extend from the front side 101*a* of the semiconductor layer 101 to the back side 101*b* of the semiconductor layer 101*b*. An electronic element 102 may be formed partially in the semiconductor layer 101.

As an example for purposes of easier illustration, and for illustration of an underlying principle of various embodiments, a single lateral field effect transistor (e.g. a metal oxide semiconductor field-effect transistor (MOSFET)) having source/drain regions 302, a body region 303 and an insulated gate 304, is shown as electronic element 102 (useful component). As will be readily understood, the principle may be equally well suited or applied to, for example, integrated circuits (IC) or vertical components.

Furthermore, two vias 103 are shown as an example in FIG. 3A, however a different number of vias 103 may be present in accordance with some embodiments.

In the prefabrication state shown in FIG. 3A, at least one wiring level, for example made of polycrystalline semiconductor material (e.g. polycrystalline silicon), may be deposited, which may also serve as the gate electrode 304 of the electronic element 102 (i.e. of the field effect transistor). This structured poly level may be insulated by means of suitable dielectric material (or short, dielectric). In FIG. 3A, a first dielectric layer 307' disposed over the front side 101*a* of the semiconductor layer 101 and a second dielectric layer 307" disposed over the first dielectric layer 307' are shown as an example. The gate electrode 304 may be disposed over the first dielectric layer 307' and may thus be electrically insulated from the body region 303, as shown. Also, in accordance with some embodiments, the vias 103 may extend through the first dielectric layer 307', as shown in FIG. 3A.

For example in integrated circuits, additional wiring levels (not shown in the figures) may be present between the first drawn poly layer and a topmost row of contact holes 108 (see FIG. 3B), as may be readily understood by one of skill in the art.

FIG. 3B shows in a view 310 another processing stage.

It is shown that a topmost row of contact holes 108 has been formed, for example etched. Four contact holes 108 are shown as an example, with two of the four contact holes 108 being located over the vias 103 and extending through the second dielectric layer 307" down to the vias 103, and the other two of the four contact holes 108 being located over the source/drain regions 302 and extending through the second dielectric layer 307" and the first dielectric layer 307' down to the source/drain regions 302. In accordance with other embodiments, a different number of contact holes 108 may be formed (e.g. etched). For easier illustration of the principle of exemplary embodiments, a contact hole that may be connected to the gate electrode 304 has been omitted in FIG. 3B but may be present in accordance with various embodiments. As will be readily understood, such a contact may serve as a part of an electrical connection between the gate electrode 304 and other signals in an integrated circuit and/or an external gate pin.

At least in small structures the contact holes 108 may be filled immediately with, for example, tungsten (W) or polysilicon (poly) plugs (alternatively, with another suitable plug material), in accordance with some embodiments. For sufficiently large contact holes 108 they may also be contacted with metal and/or in-situ with the subsequent wiring level, in accordance with some embodiments.

FIG. 3C shows in a view 320 another processing stage.

In accordance with various embodiments and as shown in FIG. 3C, an additional dielectric layer (in the example shown, a third dielectric layer 307''') may be formed (e.g. deposited) over the dielectric layer with the topmost contact holes 108 (in the example shown, over the second dielectric layer 307").

FIG. 3D shows in a view 330 another processing stage.

In accordance with various embodiments and as shown in FIG. 3D, the third dielectric layer 307''' may be structured (or patterned) to form recesses 308 in the third dielectric layer 307''' so that topmost conductive lines or traces (also referred to as redistribution traces) of a front side metallization layer 104 may later be led in the recesses 308 of the structured third dielectric layer 307''' (see FIG. 3E). In other words, parts of the third dielectric layer 307''' may be removed to expose parts of the underlying second dielectric layer 307" and the contact holes 108. The remaining parts of the third dielectric layer 307''' may, for example, have the shape of a ridge or wall.

FIG. 3E shows in a view 340 another processing stage.

In accordance with various embodiments and as shown in FIG. 3E, a front side metallization layer 104 may be formed in the recesses 308 of the structured third dielectric layer 307'''. In other words, conductive lines or redistribution traces 341 of the front side metallization layer 104 may be formed in the recesses 308. Two redistribution traces 341 are shown as an example in FIG. 3E, each redistribution trace 341 electrically connecting the electronic element 102 (clearly, one of the source/drain regions 302 of the field effect transistor in this example) to a respective one of the vias 103 via a respective one of the contact holes 108. In accordance with other embodiments, the front side metallization layer 104 may include only one or may include more than two (e.g. a plurality or multiplicity of) conductive lines or redistribution traces 341.

The front side metallization layer 104 may include or may be made of a suitable metallization material such as, for example, aluminum (Al), copper (Cu), carbon (C), nickel (Ni), or an alloy and/or stack of layers including one or more of the aforementioned materials. Alternatively or additionally, the front side metallization layer 104 may include or may be made of other suitable metallization materials, e.g. other metals or metal alloys. In accordance with some embodiments, a bather layer may be formed between the metallization layer 104 and/or the conductive filling material of the contact hole 108 and the semiconductor material 101 and/or one or more of the dielectric layers 307', 307", 307'''. This bather layer may, for example, consist of or may include nitride materials, for example $Si_3N_4$ (also as non-stoichiometric compound), TiN, TaN or other suitable materials. In accordance with some embodiments, the upper surface 104a of the front side metallization layer 104 may be coated with a material preventing oxidation such as, for example, a polymer or e.g. a noble metal such as silver (Ag) or gold (Au) or another suitable material.

The front side metallization layer 104 may, for example, be formed galvanically (in other words, using a galvanic deposition process) or using metal pastes that may be coated by means of a squeegee, to allow for thick layers and low path resistances, for example in power semiconductors, in accordance with various embodiments. In an alternative embodiment the metallization layer 104 may be homogeneously deposited over the surfaces of the second dielectric layer 307", the contact holes 108 and the surface of the third dielectric layer 307'''. The metallization layer 104 subsequently may be structured by means of chemical mechanical polishing (CMP) using the upper edges or surfaces 307a''' of the ridges or walls of the structured third dielectric layer 307''' as supporting structure. In accordance with other embodiments, also standard metallizations as known from integrated circuits may be used.

In accordance with various embodiments, it may be provided that an upper edge or surface 104a of the front side metallization layer 104 or conductive lines 341 (i.e. of the material (e.g. metal) of the conductive lines) does not lie higher than an upper edge or surface 307a''' of the surrounding dielectric material of the third dielectric layer 307''', as shown. This may, for example, be used to prevent electrical shorts that might otherwise possibly occur due to generation of cavities. Furthermore, this may, for example, be used to account for different thermal expansion coefficients of the material of the conductive lines (e.g. metal) and the surrounding dielectric. In particular, metal may have a higher thermal expansion coefficient than dielectric material (e.g. silicon oxide). Thus, in case that the upper surface 104a of the conductive lines or traces of the front side metallization layer 104 and the upper surface 307a''' of the surrounding third dielectric layer 307' were coplanar and a cap is disposed over the third dielectric layer 307' and the front side metallization layer 104, as described further below in connection with FIG. 3F, the higher thermal expansion coefficient and thus stronger expansion of the metal upon heating might cause spalling (chipping off) of the cap during subsequent anneal processes. FIG. 3F shows an embodiment, where there is a clear distance (denoted by reference numeral 110) between the material (e.g. metal) of the conductive lines or traces 341 of the front side metallization layer 104 and the cap 105. In accordance with other embodiments, the distance 110 may be significantly smaller, for example in case that a CMP (chemical mechanical polishing) process has been used for structuring the topmost metal layer.

In accordance with some embodiments, one or more bather layers may optionally be provided in the semiconductor component between metal and dielectric material and/or semiconductor material in the semiconductor component. These barrier layers are not shown in the figures for sake of simplicity.

FIG. 3F shows in a view 350 another processing stage.

In accordance with various embodiments and as shown in FIG. 3F, a cap 105 may be bonded on the upper surface 307a''' of the uppermost dielectric (i.e. the third dielectric layer 307''' in this example). The cap 105 may have an upper surface 105a and a lower surface 105b opposite the upper surface 105a. The lower surface 105b may face the semiconductor layer 101, as shown. The cap 105 may have similar lateral dimensions as the wafer 305 and may also serve as a carrier in subsequent process steps.

The cap 105 may, for example, be made of glass and may be applied on the structured topmost dielectric layer (i.e. on the third dielectric layer 307''' in this example), e.g. on ridge-like structures of the third dielectric layer 307', for example by means of anodic bonding, adhesive bonding or by means of glass frit.

Depending on the materials used for the cap 105, a diffusion bather (not shown in the figures), for example against sodium (Na) ions, for example a silicon nitride ($Si_3N_4$) layer, may be provided directly below the topmost dielectric layer (i.e. the third dielectric layer 307''' in this example) or, alternatively, deeper in the wiring stack in accordance with some embodiments.

Furthermore, in accordance with some embodiments a horizontal diffusion bather may be provided, for example by means of a circumferential trench (in other words, a trench surrounding the active or device area) filled with metal.

In some embodiments, at least for some dielectric walls (of the structured third dielectric layer 307''') between neighboring redistribution lines or traces 341 of the front side metallization layer 104, a continuous connection may be formed between the respective dielectric wall (of the structured third dielectric layer 307''') and the cap 105, which may electrically insulate. In other words, a dielectric wall of the third dielectric layer 307''' may abut the cap 105 and thus neighboring redistribution traces 341 of the front side metallization layer 104 may be electrically insulated from each other by the dielectric wall in-between. Thus, a distance between two lines 341 having different electrical potentials may be reduced in accordance with some embodiments. Many points of support may also provide for an improved stabilization of a thin wafer.

Illustratively, in accordance with various embodiments, a cap 105 may be bonded to an uppermost dielectric layer 307''' of a layer stack disposed over a thin semiconductor useful layer 101 and may thus be mechanically coupled to a wafer 305 (in particular, to the semiconductor useful layer 101 located over a carrier portion 301 of the wafer 305).

In accordance with some embodiments, the bonding process, in which the cap 105 is bonded to the wafer, may optionally be carried out under at least low vacuum. This may, for example, be applied in cases where, in the wafer processing, the layer stack is subsequently subjected to vacuum processes and cavities remain between the cap 105 and the chip.

In the subsequent fabrication process, the cap 105 may have the same function as, for example, a glass carrier. However, the cap 105 may not need to be removed from the front side of the wafer anymore but may remain on the chip forever.

The thickness of the cap 105 may be chosen suitably, for example in such a manner that a sufficient mechanical stability of the wafer stack may be achieved during the further processing. For example, in accordance with some embodiments, the cap thickness may be in the range from about 50 µm to about 1000 µm, for example in the range from about 100 µm to about 500 µm in accordance with some embodiments. Alternatively, the cap thickness may have other values.

The thickness of the cap 105 may for example depend on the thickness of the semiconductor useful layer 101.

In accordance with some embodiments, the cap 105 may be configured as an opaque cap. In other words, the cap 105 may include or may be made of an opaque material. In this way, the semiconductor material of the semiconductor layer 101 beneath the cap 105 may be shielded from light sources during later operation.

As the cap 105 does not have to be removed (in other words, detached) again, a temperature limitation of subsequent fabrication processes to e.g. approximately 150° C. to 250° C. may no longer be required. Instead, the temperature limit may now be defined by the metallization and may, for example, be in the range from approximately 400° C. to 450° C. in accordance with some embodiments. In other words, higher temperatures may be used in subsequent fabrication processes, for example temperatures up to approximately 400-450° C. in accordance with some embodiments.

In accordance with various embodiments, the stack including the cap 105 may be suitable for vacuum processes and/or wet chemical processes.

In accordance with various embodiments, the cap 105 may serve as a carrier during a subsequent thinning of the wafer 305 from the wafer back side 305b, as is shown in FIG. 3G.

FIG. 3G shows in a view 360 another processing stage.

In accordance with various embodiments and as shown in FIG. 3G, the wafer 305 may be thinned from the wafer back side 305b to remove the carrier portion 301 of the wafer 305 such that the semiconductor useful layer 101 of the wafer 305 remains. The thinning may, for example, be achieved using conventional techniques such as, for example, grinding and/or polishing and/or etching and/or CMP (chemical mechanical polishing). In this connection, a lower side of the vias (through-contacts) 103 may, for example, be used for end-point detection. In other words, thinning of the wafer 305 may stop, for example, at or near the lower side of the vias 103.

After the thinning of the wafer 305, the back side of the wafer 305 may substantially coincide with the back side 101b of the semiconductor layer 101 and the wafer thickness may substantially be the thickness of the semiconductor layer 101. For example, in accordance with some embodiments, the wafer thickness (i.e. thickness of the semiconductor layer 101) after thinning may, for example, be in the range from about 1 µm to about 70 µm, for example in the range from about 1 µm to about 50 µm in some embodiments, for example in the range from about 1 µm to about 30 µm in some embodiments, for example in the range from about 1 µm to about 15 µm in some embodiments. Alternatively, other values of the wafer thickness may be possible.

As a stable carrier (namely the cap 105) is located on the thin wafer 305 (in other words, is mechanically coupled to the thin semiconductor useful layer 101), further process steps may now be possible without difficulty. The wafer handling may be carried out on the cap 105.

For example, structured ion implantations or ion implantations over the whole surface and/or annealings may optionally be carried out on the wafer back side, and/or a bottom passivation may optionally be applied and structured on the wafer back side in accordance with some embodiments, as shown in FIG. 3G, which shows an implantation region 361 formed in the semiconductor layer 101 by means of structured ion implantation, and a structured passivation layer 109 on the wafer back side (i.e. the back side 101b of the semiconductor layer 101).

In accordance with various embodiments, aligned photo techniques may be possible on the exposed wafer back side using the end of the vias 103 for alignment.

In accordance with various embodiments, due to the stable cap carrier 105 there are no limitations in the wafer handling.

In accordance with various embodiments, a back side metallization layer 106 may be disposed over parts of the back side 101b of the semiconductor layer 101 and electrically connected to the vias 103 to electrically contact the electronic element 102, as shown. In the embodiment shown in FIG. 3G, the metallization layer 106 includes a first portion 362 and a second portion 363, each being electrically connected to a respective one of the two vias 103. Thus, by means of the first and second portions 362, 363 of the back side metallization layer 106 the source/drain regions 302 of the transistor 102 may be electrically contacted. The first portion 362 and the second portion 363 of the back side metallization layer 106 may be disposed over the passivation layer 109 and may be electrically insulated from the semiconductor layer 101 by means of the passivation layer 109, as shown.

In accordance with the embodiment shown, the back side metallization layer 106 may include a third portion 364 that may be in contact with the implantation region 361, as shown. Thus, a substrate contact may be provided.

In accordance with various embodiments, the back side metallization layer 106 may include or may be made of a suitable metallization material such as, for example, aluminum (Al), copper (Cu), nickel (Ni), tungsten (W), titanium (Ti), or an alloy and/or stack of layers including one or more of the aforementioned materials. In accordance with some embodiments and, for example, for easier assembly these conductive materials may be coated with other conductive materials like e.g. silver (Ag), gold (Au), nickel (Ni), tin (Sn) to improve e.g. corrosion behavior or wettability during later soldering processes. Alternatively or additionally, the back side metallization layer 106 may include or may be made of other suitable metallization materials, e.g. other metals or metal alloys.

In accordance with some embodiments, solder bumps 365 may be applied to the back side metallization layer 106 to electrically contact the back side metallization from outside, as shown in FIG. 3G.

In accordance with some embodiments and as shown in FIG. 3G, the semiconductor component may have a direct contact of the substrate (i.e. of the semiconductor layer 101) to one or more solder bumps 365 (in the example shown in FIG. 3G, one solder bump 365 contacts the third portion 364 of the back side metallization layer 106, which in turn contacts the implantation region 361 of the semiconductor layer 101). In this case, a contact layer (clearly, the third portion 364 of the back metallization layer 106 in the example shown in FIG. 3G) may be provided at the same time as a diffusion barrier for the solder material.

In accordance with some embodiments, the solder bumps 365 may, for example, be deposited on wafer level in the front-end, which may facilitate processing.

In accordance with various embodiments, an electrical test and, if necessary, inking (i.e. marking of inoperable components) may be carried out, for example on wafer level after formation of the contact layer (i.e. back side metallization layer 106) or after formation of the solder bumps 365.

In accordance with various embodiments, further processes on the cap side, such as, for example, marking with a stamp, lasing, etc., are possible and may be reasonable as the cap 105 may at the same time serve as a package (or at least as a part of the package) of the component or chip.

In accordance with various embodiments, dicing of the chips may subsequently be carried out, for example using known processes such as, for example, sawing.

In accordance with some embodiments, dicing (e.g. sawing) may be carried out from the bottom side of the component. To this end, the cap 105 (more precisely, the upper surface 105a of the cap 105) may, for example, be laminated to a conventional sawing foil. In accordance with some embodiments, the semiconductor layer 101 may include or may be made of silicon and the cap 105 may include or may be made of glass or $SiO_2$. Sawing of silicon (Si) on glass or $SiO_2$ may generally be achieved without difficulty.

Sawing from the bottom side may, for example, have the effect that it may be avoided that parts of the thin semiconductor layer 101 are broken away by the mechanical pressure of the sawing blade instead of being cut away by the sawing blade.

Alternatively, dicing (e.g. sawing) might also be achieved from the top side of the component.

In accordance with alternative embodiments, dicing of the chips may be achieved using other known techniques such as, for example, laser cutting or plasma etching.

In accordance with various embodiments, after dicing of the chips the component may, for example, be delivered either on the sawing frame or after repacking e.g. in Tape and Reel or another transportation package.

Illustratively, FIG. 3G shows a semiconductor component in accordance with an embodiment. The semiconductor component may include a semiconductor layer 101 having a front side 101a and a back side 101b, at least one electronic element 102 formed at least partially in the semiconductor layer 101, at least one via 103 formed in the semiconductor layer 101 and leading from the front side 101a to the back side 101b of the semiconductor layer 101, a front side metallization layer 104 disposed over at least a part of the front side 101a of the semiconductor layer 101, to electrically connect the at least one electronic element 102 with the at least one via 103, a cap 105 disposed over the front side metallization layer 104 and configured as a front side carrier, and a back side metallization layer 109 disposed over at least a part of the back side 101b of the semiconductor layer 101 and electrically connected to the via 103, to electrically contact the at least one electronic element 102.

In accordance with various embodiments, a semiconductor component (e.g. a chip) may be provided having integrated through-contacts (or vias, e.g. through-silicon-vias (TSV)) and a bonded cap, which may form an in-situ carrier during a fabrication process of the semiconductor component (e.g. chip).

In accordance with various embodiments, the semiconductor component (e.g. chip) may be contacted by means of a metallization on the back side (e.g. chip back side).

In accordance with various embodiments, the cap may be cut together with a semiconductor useful layer (and possibly other layers, e.g. dielectric layers, passivation layers, barrier layers, metallization layers, etc.) of the semiconductor component (e.g. chip) during a dicing process.

In accordance with various embodiments, the cap may remain in the fully-processed semiconductor component (e.g. chip). In other words, once applied it may not be necessary to remove the cap again.

In accordance with various embodiments, the cap may serve at the same time as a package (or at least as a part of the package) for the semiconductor component (e.g. chip).

An important aspect of a package may be seen in the prevention of an intrusion of contaminants into the semiconductor body. To this end, a semiconductor component in accordance with various embodiments may include one or more barrier layers, such as for example $Si_3N_4$ layers, on the front side or back side and/or a metal covering of contact holes (e.g. contact holes 108 in the embodiments shown in the figures). In accordance with some embodiments, an overlap of the metal covering and the contact holes or plugs may be provided. In order to prevent in-diffusion of contaminants from a sawing trace into the semiconductor (e.g. into the semiconductor layer 101) a circumferential TSV (through-silicon-via) trench may, for example, be provided in accordance with some embodiments. In order to save space, this trench-like electrical connection might also be used functionally, for example as a source contact or drain contact of a vertical transistor, in accordance with some embodiments.

Another effect of a semiconductor component in accordance with various embodiments may be seen in that the cap (e.g. cap 105 in the embodiments shown in the figures) and the thinned chip may provide a stable carrier stack that may allow for using essentially the same equipment and processes on the back side of the semiconductor component as in the BEOL (back end of line) block on the chip front side. Thus, an additional redistribution, if necessary having several metal layers or levels, may, for example, be possible on the back side of the chip, as shown in FIG. 4 and FIG. 5.

Figure 4:
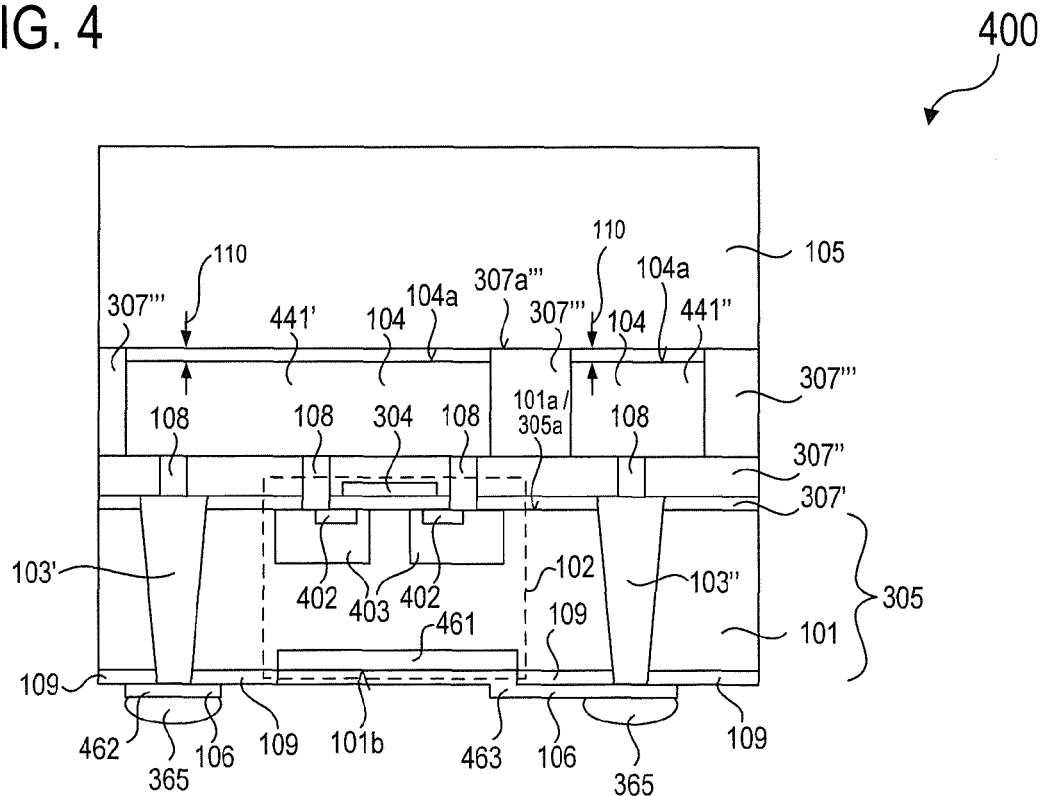
FIG. 4 shows a semiconductor component in accordance with an embodiment.
Figure 5:
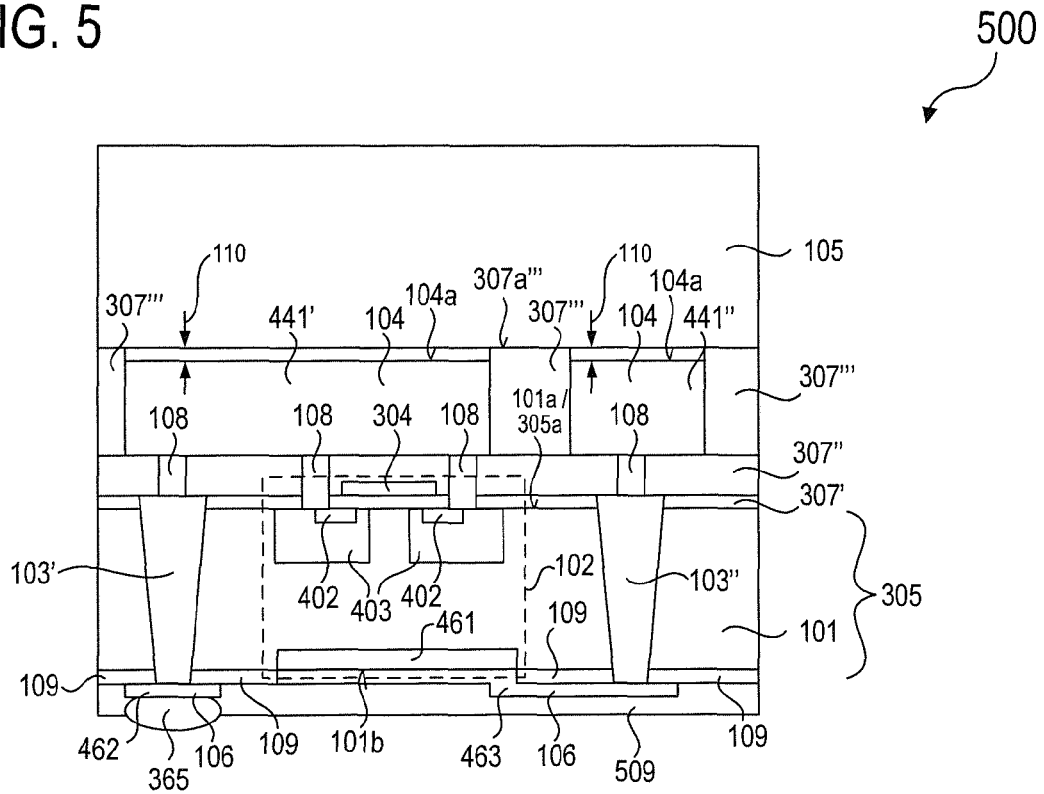
FIG. 5 shows a semiconductor component in accordance with an embodiment.

FIG. 4 shows a semiconductor component 400 in accordance with an embodiment. The semiconductor component 400 may be, to some degree, similar to the semiconductor component shown in FIG. 3G and the same reference numerals denote the same elements as there and will not be described in detail again here.

As an example, the semiconductor component 400 includes a quasi-lateral DMOS (double-diffused MOS) field effect transistor as electronic element 102. The DMOS field effect transistor 102 may be part of an integrated circuit (IC) formed at least partially in the semiconductor layer 101. FIG. 4 shows only a section of the integrated circuit (including the DMOS 102), and the integrated circuit may include additional electronic elements (not shown), as will be readily understood.

The DMOS 102 may be configured as a vertical component including one or more source regions 402 (two source regions 402 are shown as an example), one or more body regions 403 (two body regions 403 are shown as an example), an insulated gate 304, and a buried drain region or drain terminal 461. The source regions 402 may be electrically connected (via respective contact holes 108) to a first conductive line or redistribution trace 441' of the front side metallization layer 104, which in turn may be electrically connected (via another contact hole 108 and a first via 103' leading through the semiconductor layer 101) to a first portion 462 of a back side metallization layer 106 disposed over the back side 101b of the semiconductor layer 101. The buried drain region 461 may be electrically connected to a second portion 463 of the back side metallization layer 106, as shown. The second portion 463 of the back side metallization layer 106 in turn may be electrically connected (via a second via 103" leading through the semiconductor layer 101 and another contact hole 108) to a second conductive line or redistribution trace 441" of the front side metallization layer 104. The second conductive line or redistribution trace 441" may further be electrically connected to another electronic element of the integrated circuit (not shown), in accordance with some embodiments.

In accordance with the embodiment shown in FIG. 4, solder bumps 365 may be applied to both the first portion 462 and the second portion 463 of the back side metallization layer 106. In this way, both the source regions 402 and the buried drain region 461 of the DMOS 102 may be electrically contacted from outside.

An electrical contact to the gate 304 of the DMOS field effect transistor 102 may be present in accordance with various embodiments but is not shown in FIG. 4 for simplicity.

In accordance with the embodiment shown in FIG. 4 a buried drain terminal 461 may be connected in a low-ohmic manner via the back side to the front side of a semiconductor component (e.g. chip). In this context, the second portion 463 of the back side metallization layer 106 may illustratively serve as a redistribution trace on the back side of the semiconductor component. Low-ohmic connections for a buried drain of a field effect transistor, or analogously for a buried collector in bipolar transistors, may represent an important contribution to good performance of lateral transistors in integrated circuits.

FIG. 5 shows a semiconductor component 500 in accordance with an embodiment. While FIG. 4 shows a semiconductor component 400 with redistribution on the chip back side and contacting of the drain terminal 461 to the outside, FIG. 5 shows a similar semiconductor component 500 without contacting of the drain terminal 461 to the outside. The semiconductor component 500 may, for example, include an additional passivation layer 509 on the back side covering the second portion 463 of the back side metallization layer 106 and parts of the passivation layer 109, as shown in FIG. 5. This means in other words that, in accordance with some embodiments, the back side metallization layer 106 may be used to redistribute any electrical signal on the backside similar to the at least one redistribution layer 104 on the front side of the chip. Such electrical signal may be a drain signal of a transistor as shown in the embodiment of FIG. 5 but may also be any other kind of signal available on the chip in accordance with other embodiments. In an integrated circuit, for example, several different signals including different drain signals may be connected to the back side of the chip and/or be redistributed on the back side of the chip, in accordance with some embodiments.

As in the semiconductor component 400 of FIG. 4, an electrical contact to the gate 304 of the DMOS field effect transistor 102 may be present in the semiconductor component 500 of FIG. 5 in accordance with various embodiments but is not shown in FIG. 5 for simplicity.

Differently from the embodiments shown in FIG. 4 and FIG. 5, a connection of the transistor 102 on the chip back side may not need to be provided at all, for example in cases where the transistor 102 is part of an electrical circuit and the electrical signal is directly further processed in the circuit. In this case, another circuit element electrically connected to the transistor 102 may, for example, have a connection on the chip back side in accordance with various embodiments.

In accordance with some embodiments, structures analogous to the ones shown in FIG. 4 and FIG. 5 may, for example, also be used as ESD (electrostatic discharge) protection structures or the like.

In accordance with some embodiments, the (mechanical) connection between the cap and the chip may be structured in a relatively coarse manner, analogously e.g. to the procedure in a tire pressure sensor. This procedure may, for example, be applied particularly in cases where the chip area may be small or the semiconductor useful layer may be not too thin, e.g. may possess still more than approximately 10-20 μm of thickness and thus some mechanical stability.

In this connection, the cap may, for example, be configured or structured to have a large-scale recess and may be bonded onto the chip at the edges or edges of the recess, as is illustrated and will be described below in connection with an exemplary embodiment shown in FIG. 6, or the cap may be bonded to the chip via a structured spacer layer, as is illustrated and will be described below in connection with an exemplary embodiment shown in FIG. 7.

Figure 6:
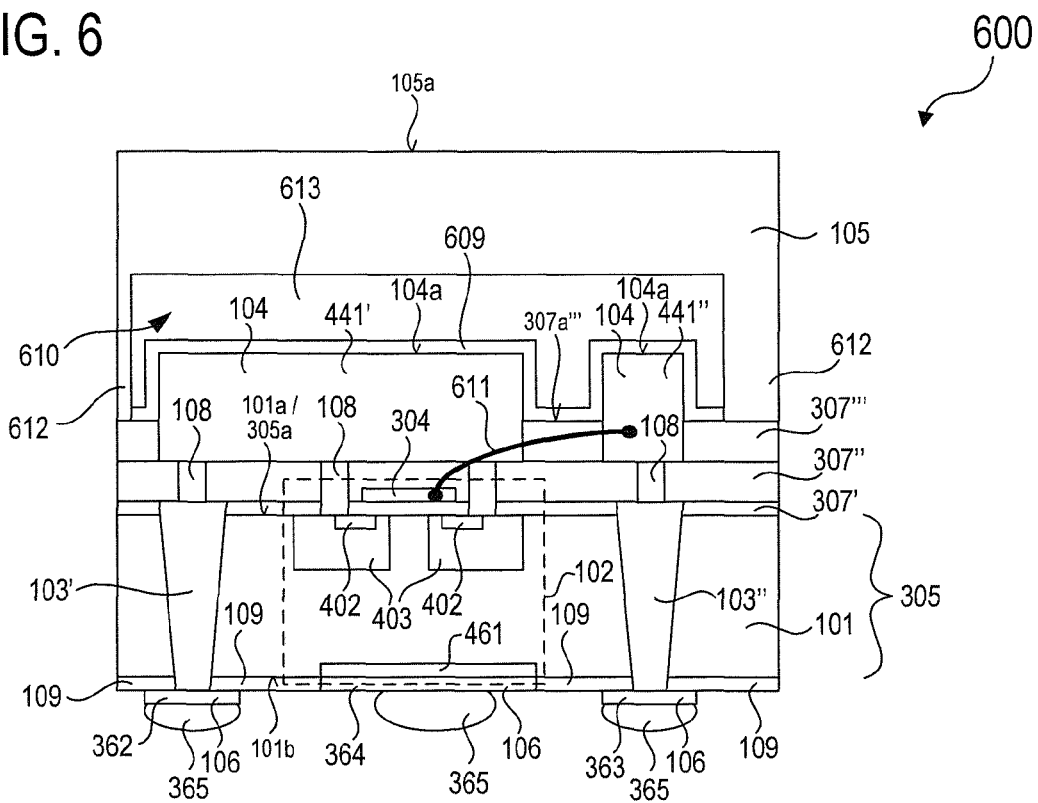
FIG. 6 shows a semiconductor component in accordance with an embodiment.

FIG. 6 shows a semiconductor component 600 in accordance with an embodiment. The semiconductor component 600 may be, to some degree, similar to the semiconductor components described herein above, and the same reference numerals denote the same elements as there and will not be described in detail again here.

The semiconductor component 600 includes a vertical discrete MOSFET as electronic element 102. In other words, the semiconductor component 600 may be configured as a vertical discrete MOSFET. The MOSFET may include one or more source regions 402 (two source regions 402 are shown as an example), one or more body regions 403 (two body regions 403 are shown as an example), a buried drain region 461 and an insulated gate 304.

The source regions 402 may be electrically connected (via respective contact holes 108) to a first conductive line or redistribution trace 441' of the front side metallization layer 104, which in turn may be electrically connected (via another contact hole 108 and a first via 103' leading through the semiconductor layer 101) to a first portion 362 of a back side metallization layer 106 disposed over the back side 101b of the semiconductor layer 101.

The gate 304 may be electrically connected to a second conductive line or redistribution trace 441" of the front side metallization layer 104 via an electrically conductive connection (only shown schematically in FIG. 6 by means of a connection line 611). The second conductive line or redistribution trace 441" may in turn be electrically connected (via another contact hole 108 and a second via 103" leading through the semiconductor layer 101) to a second portion 363 of the back side metallization layer 106.

The buried drain region 461 may be electrically connected to a third portion 364 of the back side metallization layer 106, as shown.

Solder bumps 365 may be applied to the first, second and third portions 362, 363, 364 of the back side metallization layer 106. In this way, the source regions 402, the gate 304 and the buried drain region 461 of the vertical MOSFET 102 may be electrically contacted from outside via the back side of the semiconductor component 600.

In accordance with the embodiment shown in FIG. 6, the semiconductor component 600 may have a cap 105 applied to the front side of the semiconductor component 105 with a (mechanical) connection to the cap 105 being structured on a large-scale. In accordance with this embodiment, the cap 105 may be structured to have a large-scale recess 610 and may be bonded to the chip at an edge or edges of the recess 610. For example, the cap 105 may be bonded to the chip (clearly, to the third dielectric layer 307' in accordance with the embodiment shown in FIG. 6) via one or more ridge-shaped protrusions 612 of the structured cap 105 located at an edge or edges of the cap 105, as shown. Thus, in accordance with the embodiment shown, the cap 105 may be mechanically coupled to the semiconductor layer 101 via the cap 105's protrusions 612, and the third dielectric layer 307'", the second dielectric layer 307" and the first dielectric layer 307'.

In accordance with some embodiments, a passivation layer 609 may be disposed over the front side metallization layer 104 (for example, over the first and second electrically conductive lines 441', 441" as shown in FIG. 6) and electrically insulating the front side metallization layer 104 from the cap 105. In the embodiment shown in FIG. 6, the passivation layer 609 may further be disposed over parts of the third dielectric layer 307'". In accordance with some embodiments, the semiconductor component 600 may be configured such that a cavity 613 may be located between the cap 105 and the front side metallization layer 104 (or the passivation layer 609 covering the front side metallization layer 104, if present), as shown. In accordance with some embodiments, the cap 105 might also be coupled directly to the passivation layer 609.

Figure 7:
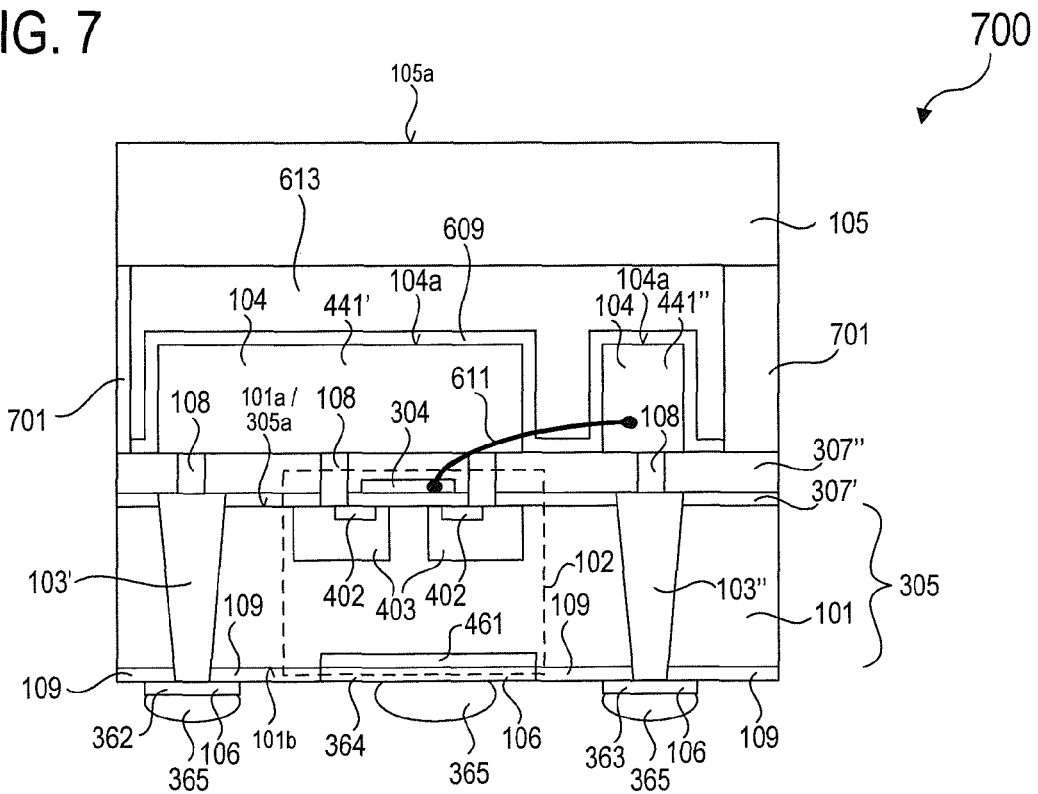
FIG. 7 shows a semiconductor component in accordance with an embodiment.

FIG. 7 shows a semiconductor component 700 in accordance with an embodiment where a (mechanical) connection between the cap and the chip is structured in a relatively coarse manner, similar to the semiconductor component 600 described above. The semiconductor component 700 may include a discrete vertical MOSFET as electronic element 102 with similar wiring architecture as in the semiconductor component 600 of FIG. 6.

The semiconductor component 700 differs from the semiconductor component 600 mainly in that a structured spacer layer 701 may be provided and that the cap 105 (which itself may be unstructured) may be bonded to the spacer layer 701 and thus mechanically coupled to the semiconductor layer 101. In accordance with the embodiment shown, the spacer layer 701 may be disposed over the second dielectric layer 307" and thus may be mechanically coupled to the semiconductor layer 101 via the second dielectric layer 307" and the first dielectric layer 307'. In accordance with some embodiments, a passivation layer 609 may be disposed over the front side metallization layer 104 (for example, over the first and second electrically conductive lines 441', 441" as shown in FIG. 7) and electrically insulating the front side metallization layer 104 from the cap 105. The passivation layer 609 may further be disposed over parts of the second dielectric layer 307", as shown. The spacer layer 701 may be at least as thick as the front side metallization layer 104 (and the passivation layer 609, if present). In the embodiment shown in FIG. 7, the spacer layer 701 has a thickness that is larger than the combined thicknesses of the front side metallization layer 104 and the passivation layer 609.

In accordance with some embodiments, the passivation layer 609 may optionally be provided in the semiconductor components 600, 700 described above in connection with FIG. 6 and FIG. 7. In other words, in accordance with some embodiments a passivation may be provided on the chip front side, as may be common in today's fabrication processes. As, in accordance with various embodiments, contacting of the chip may be achieved exclusively via the back side, (small-scale) structuring of the front-side passivation may not be required in accordance with some embodiments. This may, for example, improve impermeability of the passivation.

In accordance with some embodiments, the cap may be used as a carrier for mounting the semiconductor component on a lead frame using, for example, conventional techniques. In this connection, the cap may be fixed on a lead frame, for example by means of an adhesive process or, after deposition of a corresponding metallization on the cap, by means of soldering (e.g. diffusion soldering), as illustrated in FIG. 8.

FIG. 8 shows a semiconductor component arrangement 800' including a semiconductor component 800 mounted on a lead frame 803, in accordance with an embodiment. The semiconductor component 800 may include a discrete vertical MOSFET as electronic element 102 with similar wiring architecture as in the semiconductor components 600 and 700 of FIG. 6 and FIG. 7, as shown in FIG. 8. Alternatively, the semiconductor component 800 may include or may consist of any other electronic device or integrated circuit. A passivation layer 609 may be disposed over the front side metallization layer 104 and may cover the upper surface 104a and side walls of the individual redistribution traces 441', 441" of the front side metallization layer 104. In addition, a dielectric layer 801 may be disposed over exposed parts of the second dielectric layer 307" and over parts of the passivation layer 609, and may be planarized to be level with the passivation layer 609. The cap 105 may be bonded to the passivation layer 609 and dielectric layer 801, as shown. In the semiconductor component 800, the cap 105 may be used as an assembly aid for mounting the semiconductor component 800 onto a lead frame 803.

FIG. 8 may show a prefabrication state of the semiconductor component 800 after a die bonding process and, for example, before a wire bonding process and a molding process. The cap 105 (more precisely, the upper surface 105a of the cap 105) may be attached to the lead frame 803, for example by means of an adhesive layer 802 in accordance with an embodiment (as shown in FIG. 8), or by means of a metallization stack and solder material in accordance with another embodiment.

As, due to the mechanically stable cap 105, picking of the semiconductor component 800 or chip may be realized in a similar or the same manner as with conventional chips, chip assembly may become easier and faster.

In case that an insulator such as, for example, glass is used as the carrier material (i.e. material of the cap 105), then the lead frame 803 may be electrically insulated from the semiconductor component 800 or chip. This may, for example, offer various possibilities for a chip-by-chip integration in one package. For example, control circuitry and a power switch (or power switches) may be integrated on a lead frame in this way without additional insulation efforts in accordance with some embodiments.

Some components such as, for example, power ICs or power transistors may require stronger cooling. In this connection, the isolated assembly technique of a semiconductor component or chip in accordance with various embodiments described herein may facilitate thermal coupling to a cooling element or heat sink.

In particular, in accordance with some embodiments, the semiconductor component's cap may be fixed to a cooling element or heat sink, for example via a heat conducting paste, as shown in FIG. 9.

FIG. 9 shows a semiconductor component arrangement 900' including a semiconductor component 900 mounted on a cooling element or heat sink 903, in accordance with an embodiment. The semiconductor component 900 may, for example, be similar to the semiconductor component 800 of FIG. 8, as shown in FIG. 9. In particular, the same reference numerals may denote the same parts as in FIG. 8 and will not be described in detail again here. In accordance with other embodiments, the semiconductor component 900 may be configured differently, for example in accordance with one or more embodiments described herein.

The semiconductor component 900 may, for example, be applied to the cooling element or heat sink 903 via a heat conducting paste 902 located between the cap 105 and the cooling element or heat sink 903, as shown. Using a heat conducting paste may, for example, have the effect that thermal coupling of the semiconductor component to the cooling element or heat sink may be easily realized during assembly. In accordance with other embodiments, the semiconductor component may be coupled to the cooling element or heat sink without using a heat conducting paste, for example by means of direct bonding or soldering (e.g. diffusion soldering). This may, for example, have the effect of an improved heat dissipation, e.g. compared to the coupling via a heat conducting paste.

By means of a semiconductor component in accordance with various embodiments described herein (e.g. semiconductor component 900 in FIG. 9) being mounted onto a cooling element or heat sink (e.g. cooling element or heat sink 903 in FIG. 9), an additional electrical insulation on the customer's side or a special package such as, for example, the so-called "TO-220 Fullpack" may, for example, be omitted while nonetheless an electrical functional isolation between the component and the cooling element may be achieved.

Instead of an insulating cap, also an electrically conductive cap (for example in combination with a suitable passivation on the bonding side) may be used in accordance with various embodiments. One effect of an electrically conductive cap may be an improved thermal coupling to a cooling element or heat sink.

In accordance with some embodiments, a combination of a highly conductive cap with a thin insulating coating may also be used.

In accordance with some embodiments, an electrically conductive cap might, for example, also be used to provide an electrical contact of the electronic element (for example, of a terminal region of the electronic element, e.g. of the source regions 402 in the semiconductor components 800/900 in FIG. 8 and FIG. 9) via the cap and the front side metallization layer (or at least one redistribution trace of the front side metallization layer), which in this case may be electrically connected to the cap.

In accordance with some embodiments, a plastic material or plastic laminate (for example, having a fiber reinforcement in accordance with an embodiment) may be used as the cap or carrier instead of a rigid (e.g. glass) cap. For example, similar or the same materials as used in printed circuit board (PCB) fabrication such as, for example, glass fiber epoxy resin compounds or teflon compounds may be used in accordance with some embodiments.

Also, conductive laminatable materials (i.e. materials suitable for laminating) such as, for example, metal meshes with suitable binders may be used analogously to conductive homogenous caps, in accordance with some embodiments. Although, in comparison to inorganic materials such as, for example, glass, these materials may have a lower temperature stability, they may on the other hand compensate (in other words, level) significantly larger topologies on the wafer front side and may be processable in a very easy manner.

Figure 10:
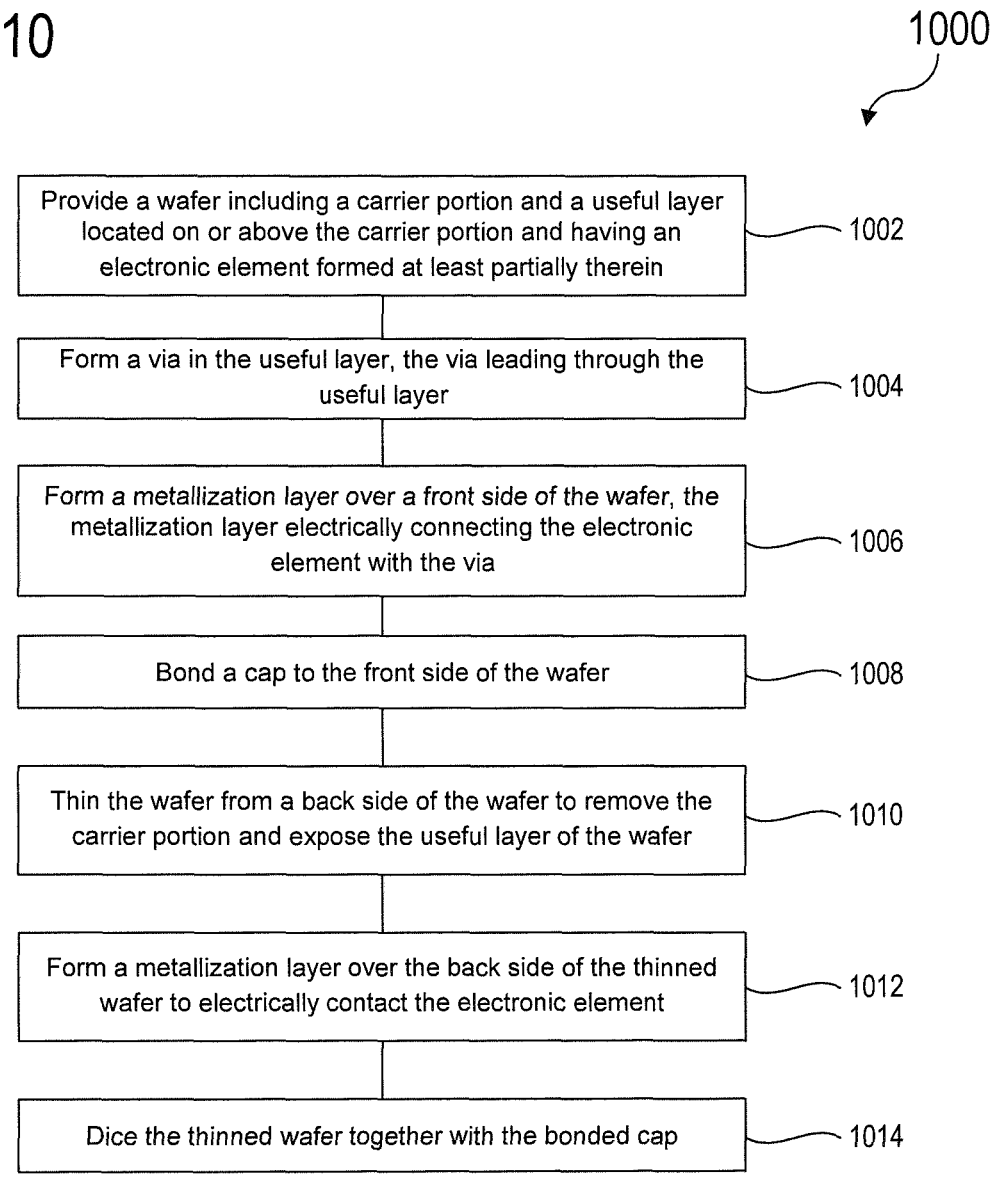
FIG. 10 shows a method of manufacturing a semiconductor component in accordance with an embodiment.

FIG. 10 shows a method 1000 of manufacturing a semiconductor component in accordance with an embodiment.

In 1002, a wafer may be provided, the wafer including a carrier portion and a useful layer located on or above the carrier portion and having an electronic element formed at least partially therein.

In 1004, a via may be formed in the useful layer, the via leading through the useful layer. The via may, for example, be formed and/or configured in accordance with one or more embodiments described herein.

In 1006, a metallization layer may be formed over a front side of the wafer, the metallization layer electrically connecting the electronic element with the via. The metallization layer may, for example, be formed and/or configured in accordance with one or more embodiments described herein.

In 1008, a cap may be bonded to the front side of the wafer. The cap may, for example, be configured in accordance with one or more embodiments described herein. Bonding of the cap may, for example, be achieved in accordance with one or more embodiments described herein.

In 1010, the wafer may be thinned from a back side of the wafer to remove the carrier portion and expose the useful layer of the wafer. Thinning of the wafer may, for example, be achieved in accordance with one more embodiments described herein.

In 1012, a metallization layer may be formed over the back side of the thinned wafer to electrically contact the electronic element. The metallization layer may, for example, be formed and/or configured in accordance with one or more embodiments described herein.

In 1014, the thinned wafer may be diced together with the bonded cap. Dicing may, for example, be achieved in accordance with one or more embodiments described herein.

A semiconductor component in accordance with various embodiments may include: a semiconductor layer having a front side and a back side; at least one electronic element formed at least partially in the semiconductor layer; at least one via formed in the semiconductor layer and leading from the front side to the back side of the semiconductor layer; a front side metallization layer disposed over at least a part of the front side of the semiconductor layer, to electrically connect the at least one electronic element with the at least one via; a cap disposed over the front side of the semiconductor layer and mechanically coupled to the semiconductor layer, the cap being configured as a front side carrier of the semiconductor component; a back side metallization layer disposed over at least a part of the back side of the semiconductor layer and electrically connected to the at least one via.

In various embodiments, the back side metallization layer may serve to electrically contact the at least one electronic element.

In various embodiments, the semiconductor layer may be a useful layer of the semiconductor component.

In various embodiments, the semiconductor layer may include or may be made of silicon.

In various embodiments, the semiconductor layer may have a layer thickness in the range from about 1 µm to about 70 µm, for example in the range from about 1 µm to about 50 µm in some embodiments, for example in the range from about 1 µm to about 30 µm in some embodiments, for example in the range from about 1 µm to about 15 µm in some embodiments. Alternatively, other values of the thickness of the semiconductor layer may be possible.

In various embodiments, the front side metallization layer may include at least one conductive trace electrically connected to the at least one electronic element and to the at least one via.

In various embodiments, the semiconductor component may include a dielectric layer disposed over parts of the front side of the semiconductor layer, and the front side metallization layer may be disposed between portions of the dielectric layer.

In various embodiments, an upper surface of the front side metallization layer may be located at a lower level or at the same level as an upper surface of the dielectric layer, with respect to the front side of the semiconductor layer.

In various embodiments, the cap may be attached to the upper surface of the dielectric layer.

In various embodiments, the cap may include a recess and may be mechanically coupled to the semiconductor layer via one or more ridge-shaped protrusions of the cap located at an edge or edges of the recess.

In various embodiments, the cap may include or may be made of an electrically insulating material.

In various embodiments, the electrically insulating material may include or may be made of at least one of: glass, a plastic material or plastic laminate, a glass fiber epoxy resin compound, a teflon compound.

In various embodiments, the cap may have a thickness in the range from about 50 µm to about 1000 µm.

In various embodiments, the cap may include or may be made of an opaque material.

In various embodiments, the semiconductor component may include a passivation layer that may be disposed between the front side metallization layer and the cap.

In various embodiments, the cap may include or may be made of an electrically conductive material.

In various embodiments, the electronic element may include or may be at least one of: a transistor, a diode, an integrated circuit.

A semiconductor component arrangement in accordance with various embodiments may include a semiconductor component in accordance with one or more embodiments described herein, and a lead frame attached to the cap of the semiconductor component.

A semiconductor component arrangement in accordance with various embodiments may include a semiconductor component in accordance with one or more embodiments described herein, and a cooling element attached to the cap of the semiconductor element.

A semiconductor component in accordance with various embodiments may include: a semiconductor useful layer having an electronic element formed at least partially therein, and having a via leading from a front side to a back side of the semiconductor layer; a front side metallization on or above the front side of the semiconductor layer and electrically connecting the electronic element with the via; a front side carrier on or above the front side metallization layer and mechanically coupled to the semiconductor layer; a back side metallization layer on or above the back side of the semiconductor layer and electrically connected to the via to electrically contact the at least one electronic element.

A method of manufacturing a semiconductor component in accordance with various embodiments may include: providing a semiconductor layer having a front side and a back side, the semiconductor layer having at least one electronic element formed at least partially in the semiconductor layer; forming at least one via in the semiconductor layer leading from the front side to the back side of the semiconductor layer; forming a front side metallization layer over at least a part of the front side of the semiconductor layer to electrically connect the at least one electronic element with the at least one via; disposing a cap over the front side of the semiconductor layer such that the cap is mechanically coupled to the semiconductor layer, the cap being configured as a front side carrier of the semiconductor component; forming a back side metallization layer over at least a part of the back side of the semiconductor layer, the back side metallization layer being electrically connected to the via to electrically contact the at least one electronic element.

In various embodiments, forming the at least one via in the semiconductor layer may include: forming at least one hole in the semiconductor layer leading from the front side to the back side of the semiconductor layer; electrically insulating the at least one hole from the semiconductor layer; filling the at least one hole with electrically conductive material.

In various embodiments, the at least one hole may be formed using an etch process.

In various embodiments, the etch process may be a dry-etch process.

In various embodiments, forming the front side metallization layer may include: forming a dielectric layer over the front side of the semiconductor layer; structuring the dielectric layer to have at least one recess; depositing electrically conductive material in the at least one recess to form at least one conductive trace of the front side metallization layer in the at least one recess.

In various embodiments, depositing the electrically conductive material in the at least one recess may include depositing the electrically conductive material such that an upper surface of the at least one conductive trace of the front side metallization layer is located at a lower level or at the same level as an upper surface of the structured dielectric layer, with respect to the front side of the semiconductor layer.

In various embodiments, disposing the cap over the front side of the semiconductor layer may include bonding the cap to the structured dielectric layer.

In various embodiments, the cap may be bonded by means of anodic bonding, adhesive bonding or glas frit.

In various embodiments, bonding the cap may be carried out under at least low vacuum conditions.

In various embodiments, the cap may have a recess, and disposing the cap over the front side of the semiconductor layer may include disposing the cap such that the cap is mechanically coupled to the semiconductor layer via one or more ridge-shaped protrusions of the cap located at an edge or edges of the recess.

In various embodiments, providing the semiconductor layer may include providing a wafer having a carrier portion and the semiconductor layer located over the carrier portion, and, after disposing the cap and before forming the back side metallization layer, the wafer may be thinned to remove the carrier portion of the wafer and expose the semiconductor layer.

In various embodiments, the semiconductor layer obtained after thinning of the wafer may have a thickness in the range from about 1 µm to about 70 µm, for example in the range from about 1 µm to about 50 µm in some embodiments, for example in the range from about 1 µm to about 30 µm in some embodiments, for example in the range from about 1 µm to about 15 µm in some embodiments. Alternatively, other values of the thickness of the semiconductor layer after thinning may be possible.

In various embodiments, a dicing process may be carried out after formation of the back side metallization layer.

A method of manufacturing a semiconductor component in accordance with various embodiments may include: providing a wafer including a carrier portion and a useful layer located on or above the carrier portion and having an electronic element formed at least partially therein; forming a via in the useful layer; forming a metallization layer over a front side of the wafer, the metallization layer electrically connecting the electronic element with the via; bonding a cap to the front side of the wafer; thinning the wafer from a back side of the wafer to remove the carrier portion and expose the useful layer of the wafer; forming a metallization layer over the back side of the thinned wafer to electrically contact the electronic element; applying a dicing process to the thinned wafer with the bonded cap.

In accordance with various embodiments, a semiconductor component may be provided. In various embodiments, the semiconductor component may include a semiconductor layer having at least one electronic element formed at least partially therein, and having at least one via leading from a front side to a back side of the semiconductor layer. In various embodiments, the semiconductor component may include a front side metallization layer disposed over at least a part of the front side of the semiconductor layer, to electrically connect the at least one electronic element with the at least one via. In various embodiments, the semiconductor component may include a cap disposed over the front side of the semiconductor layer and mechanically coupled to the semiconductor layer. In various embodiments, the cap may be configured as a front side carrier of the semiconductor component. In various embodiments, the semiconductor component may include a back side metallization layer disposed over at least a part of the back side of the semiconductor layer and electrically connected to the at least one via, to electrically contact the at least one electronic element.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor component, comprising:
   a semiconductor layer having a front side and a back side;
   at least one electronic element formed at least partially in the semiconductor layer;
   a plurality of vias formed in the semiconductor layer and leading from the front side to the back side of the semiconductor layer;
   a front side metallization layer disposed over at least a part of the front side of the semiconductor layer;
   a cap disposed over the front side of the semiconductor layer and mechanically coupled to the semiconductor layer, the cap being configured as a front side carrier of the semiconductor component, the cap electrically isolating a front side of the front side metallization layer;
   a back side metallization layer disposed over at least a part of the back side of the semiconductor layer and electrically connected to one of the plurality of vias;
   a dielectric layer disposed over parts of the front side of the semiconductor layer,
   wherein the front side metallization layer is disposed between portions of the dielectric layer, and
   wherein an upper surface of the front side metallization layer is located at a lower level as an upper surface of the dielectric layer with respect to the front side of the semiconductor layer so that at least one cavity is located between the cap and the front side metallization layer,
   wherein the front side metallization layer further comprises,
      a first redistribution conductive trace electrically connecting a first portion of the back side metallization layer with a first part of the electronic element with a first via of the plurality of vias formed in the semiconductor layer electrically coupling the first redistribution conductive trace to the first portion of the back side metallization layer, and
      a second redistribution conductive trace electrically connecting a second portion of the back side metallization layer with a second part of the electronic element with a second via of the plurality of vias formed in the semiconductor layer electrically coupling the second redistribution trace portion to the second portion of the back side metallization layer, and
   wherein the back side metallization layer further comprises a third portion disposed directly on the semiconductor layer;
   wherein the first, second, and third portions of the back side metallization layer are electrically insulated from each other, and wherein the dielectric layer electrically insulates the first and second redistribution conductive traces from each other.

2. The semiconductor component of claim 1, wherein the semiconductor layer is a semiconductor useful layer of the semiconductor component.

3. The semiconductor component of claim 1, wherein the semiconductor layer has a layer thickness in the range from about 1 µm to about 70 µm.

4. The semiconductor component of claim 1, wherein the cap is attached to an upper surface of the dielectric layer.

5. The semiconductor component of claim 1, wherein the cap comprises an electrically insulating material.

6. The semiconductor component of claim 5, wherein the electrically insulating material comprises at least one of: glass, a plastic material or plastic laminate, a glass fiber epoxy resin compound, a teflon compound.

7. The semiconductor component of claim 1, wherein the cap has a thickness in the range from about 50 µm to about 1000 µm.

8. The semiconductor component of claim 1, wherein the cap comprises an opaque material.

9. A semiconductor component arrangement, comprising:
a semiconductor component according to claim 1;
a lead frame attached to the cap of the semiconductor component.

10. A semiconductor component arrangement, comprising:
a semiconductor component according to claim 1;
a cooling element attached to the cap of the semiconductor component.

11. The method of claim 1, wherein the at least one cavity exposes an upper surface of at least one of the first redistribution trace or the second redistribution trace to the cap.

12. A semiconductor component, comprising:
a semiconductor useful layer having an electronic element formed at least partially therein, and having a plurality of vias leading from a front side to a back side of the semiconductor layer;
a front side metallization on or above the front side of the semiconductor layer and electrically connecting the electronic element with the via;
a front side carrier located above the front side metallization layer and mechanically coupled to the semiconductor layer;
a back side metallization layer on or above the back side of the semiconductor layer and electrically connected to the electronic element,
wherein the front side metallization layer further comprises,
a first redistribution conductive trace electrically connecting a first portion of the back side metallization layer with a first part of the electronic element with a first via of the plurality of vias formed in the semiconductor layer electrically coupling the first redistribution conductive trace to the first portion of the back side metallization layer, and
a second redistribution conductive trace electrically connecting a second portion of the back side metallization layer with a second part of the electronic element with a second via of the plurality of vias formed in the semiconductor layer electrically coupling the second redistribution trace portion to the second portion of the back side metallization layer, and
wherein a cavity is located between at least one of the first redistribution or the second redistribution trace and the front side carrier;
wherein the back side metallization layer further comprises a third portion disposed directly on the semiconductor layer;
wherein the first, second, and third portions of the back side metallization layer are electrically insulated from each other, and wherein the first and second redistribution conductive traces are electrically insulated from each other.

13. The method of claim 12, wherein the at least one cavity exposes an upper surface of at least one of the first redistribution trace or the second redistribution trace to the front side carrier.

* * * * *